United States Patent
Ishii et al.

(10) Patent No.: US 10,672,471 B2
(45) Date of Patent: *Jun. 2, 2020

(54) LINEARLY WEIGHT UPDATABLE CMOS SYNAPTIC ARRAY WITHOUT CELL LOCATION DEPENDENCE

(71) Applicant: INTERNATIONAL BUSINESS MACHINES CORPORATION, Armonk, NY (US)

(72) Inventors: Masatoshi Ishii, Yokohama (JP); Kohji Hosokawa, Ohtsu (JP); Atsuya Okazaki, Setagaya-ku (JP); Akiyo Iwashina, Kawasaki (JP)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 16/592,334

(22) Filed: Oct. 3, 2019

(65) Prior Publication Data

US 2020/0118622 A1    Apr. 16, 2020

Related U.S. Application Data

(63) Continuation of application No. 16/171,638, filed on Oct. 26, 2018, now Pat. No. 10,490,273.

(Continued)

(51) Int. Cl.
*G11C 11/54* (2006.01)
*G11C 13/00* (2006.01)
*G06N 3/08* (2006.01)

(52) U.S. Cl.
CPC ............ *G11C 13/004* (2013.01); *G06N 3/08* (2013.01); *G11C 11/54* (2013.01); *G11C 13/0007* (2013.01); *G11C 13/0069* (2013.01)

(58) Field of Classification Search
CPC .......... G06N 3/049; G06N 3/08; G11C 11/24; G11C 11/54
See application file for complete search history.

(56) References Cited

U.S. PATENT DOCUMENTS

| | | | |
|---|---|---|---|
| 4,956,564 A * | 9/1990 | Holler | G06N 3/063 365/185.03 |
| 5,353,382 A | 10/1994 | Yariv et al. | |
| 9,852,790 B1 | 12/2017 | Gokmen et al. | |
| 2016/0267379 A1 | 9/2016 | Eleftheriou et al. | |
| 2017/0193363 A1 | 7/2017 | Lee | |
| 2017/0329575 A1 | 11/2017 | Gu et al. | |

(Continued)

FOREIGN PATENT DOCUMENTS

| | | |
|---|---|---|
| CN | 102667826 A | 9/2012 |
| WO | 2017178352 A1 | 10/2017 |

OTHER PUBLICATIONS

List of IBM Patents or Patent Applications Treated as Related dated Oct. 3, 2019, 2 pages.

(Continued)

*Primary Examiner* — Amir Zarabian
*Assistant Examiner* — Jay W. Radke
(74) *Attorney, Agent, or Firm* — Tutunjian & Bitetto, P.C.; Vazken Alexanian

(57) ABSTRACT

A neuromorphic circuit, chip, and method are provided. The neuromorphic circuit includes a crossbar synaptic array cell. The crossbar synaptic array cell includes a Complimentary Metal-Oxide-Semiconductor (CMOS) transistor having an on-resistance controlled by a gate voltage of the CMOS transistor to update a weight of the crossbar synaptic array cell. The gate voltage of the CMOS transistor is controlled by performing a charge sharing technique that updates the weight of the crossbar synaptic array cell using non-overlapping pulses on control lines that are aligned with a set of row lines and a set of column lines.

20 Claims, 28 Drawing Sheets

Related U.S. Application Data

(60) Provisional application No. 62/745,863, filed on Oct. 15, 2018.

(56) References Cited

U.S. PATENT DOCUMENTS

| | | |
|---|---|---|
| 2018/0053089 A1 | 2/2018 | Gokmen et al. |
| 2018/0082177 A1 | 3/2018 | Boybat Kara et al. |
| 2018/0114569 A1 | 4/2018 | Strachan et al. |

OTHER PUBLICATIONS

Ambrogio et al., "Equivalent-accuracy Accelerated Neuralnetwork Training Using Analogue Memory", Nature, Jun. 2018, pp. 60-81, vol. 558.

Burr et al., "Neuromorphic Computing Using Non-Volatile Memory", Advances in Physics: X , Dec. 2016, pp. 89-124, vol. 2, No. 1.

Burr et al., Experimental Demonstration and Tolerancing of a Large-Scale Neural Network (165,000 synapses), Using Phase-Change Memory as the Synaptic Weight Element, 2014 IEEE International Electron Devices Meeting, Dec. 2014, 4 pages.

Kim et al., "Analog CMOS-based Resistive Processing Unit for Deep Neural Network Training", arXiv.org > cs > arXiv:1706.06620, Jun. 2017, 4 pages.

Tsai et al., "Recent progress in analog memory-based accelerators for deep learning", Journal of Physics D: Applied Physics, Jun. 2018, 28 pages.

International Search Report for PCT/IB2019/058366 dated Jan. 15, 2020 (5 pages).

\* cited by examiner

LINEARLY WEIGHT UPDATABLE CMOS SYNAPTIC ARRAY WITHOUT CELL LOCATION DEPENDENCE

BACKGROUND

Technical Field

The present invention generally relates to machine learning, and more particularly to a linearly weight updatable CMOS synaptic array without cell location dependence.

Description of the Related Art

An analog multiply-add accelerator is gaining significant interest due to its power efficiency. Various synaptic elements are under development, such as PCM, RRAM, MRAM, and so forth. An analog transistor is one of the options for synaptic elements because of its linearity in a triode region. However, conventional techniques involuntarily generate different pulse shapes at the near-end and the far-end of a synaptic array. Then this causes different weight update characteristics across the cell array. Hence, there is a need for a solution for weight update characteristic variation due to cell location in a synaptic array.

SUMMARY

According to an aspect of the present invention, a neuromorphic circuit is provided. The neuromorphic circuit includes a crossbar synaptic array cell. The crossbar synaptic array cell includes a Complimentary Metal-Oxide-Semiconductor (CMOS) transistor having an on-resistance controlled by a gate voltage of the CMOS transistor to update a weight of the crossbar synaptic array cell. The gate voltage of the CMOS transistor is controlled by performing a charge sharing technique that updates the weight of the crossbar synaptic array cell using non-overlapping pulses on cell control lines that are aligned with a set of row lines and a set of column lines.

According to another aspect of the present invention, a neuromorphic chip is provided. The neuromorphic chip includes a synaptic array formed from crossbar synaptic array cells. Each of the crossbar synaptic array cells includes a Complimentary Metal-Oxide-Semiconductor (CMOS) transistor having an on-resistance controlled by a gate voltage of the CMOS transistor to update each of weights of the crossbar synaptic array cells. The gate voltage of the CMOS transistor is controlled by performing a charge sharing technique that updates the weights of the crossbar synaptic array cells using non-overlapping pulses on cell control lines that are aligned with a set of row lines and a set of column lines.

According to yet another aspect of the present invention, a method is provided. The method includes forming a crossbar synaptic array cell including a Complimentary Metal-Oxide-Semiconductor (CMOS) transistor having an on-resistance controlled by a gate voltage of the CMOS transistor to update a weight of the crossbar synaptic array cell. The gate voltage of the CMOS transistor is controlled by performing a charge sharing technique that updates the weight of the crossbar synaptic array cell using non-overlapping pulses on cell control lines that are aligned with a set of row lines and a set of column lines.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

The present invention is directed to a linearly weight updatable CMOS synaptic array without cell location dependence.

In an embodiment, a charge sharing technique is used for weight updating by using non-overlapping pulses from vertical and horizontal control lines. In an embodiment, the present invention involves adding one pFET and one nFET in a synaptic unit cell, this enabling a charge sharing technique and providing a resultant fast overall operation.

Conventionally, the pulse shape difference at the near-end and the far-end can be suppressed by using a wider pulse width which undesirably reduces operation speed. In contrast, the present invention advantageously increases operation speed and maintains almost the same weight update characteristic across the cell array.

Moreover, the present invention does not require global bias circuitry and its distribution.

Also, the present invention is easy to implement in that from a circuit design point of view, it is relatively easier to maintain non-overlapping pulses that keeping pulse shapes across a cell array.

These and other ones of the many attendant advantages of the present invention are readily determined by one of ordinary skill in the art given the teachings of the present invention provided herein, while maintaining the spirit of the present invention.

Figure 1:
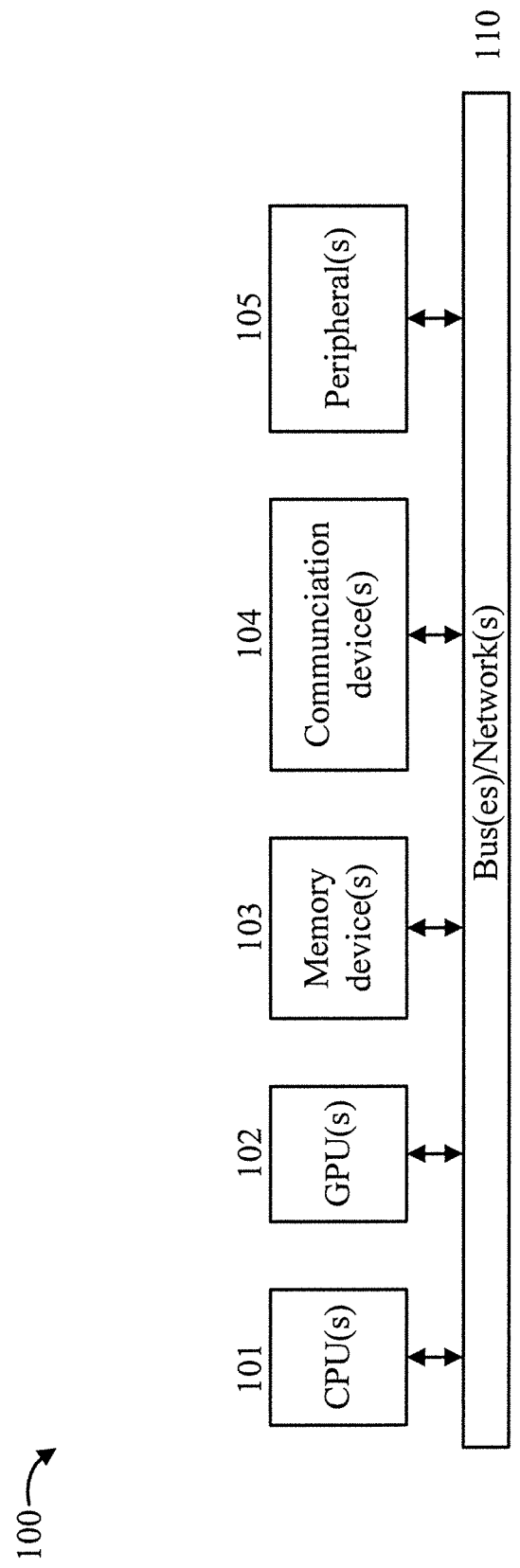
FIG. 1 is a block diagram showing an exemplary processing system to which the present invention may be applied, in accordance with an embodiment of the present invention.

FIG. 1 is a block diagram showing an exemplary processing system 100 to which the present invention may be applied, in accordance with an embodiment of the present invention. The processing system 100 includes a set of processing units (e.g., CPUs) 101, a set of GPUs 102, a set of memory devices 103, a set of communication devices 104, and set of peripherals 105. The CPUs 101 can be single or multi-core CPUs. The GPUs 102 can be single or multi-core GPUs. The one or more memory devices 103 can include caches, RAMs, ROMs, and other memories (flash, optical, magnetic, etc.). The communication devices 104 can include wireless and/or wired communication devices (e.g., network (e.g., WIFI, etc.) adapters, etc.). The peripherals 105 can include a display device, a user input device, a printer, an imaging device, and so forth. Elements of processing system 100 are connected by one or more buses or networks (collectively denoted by the figure reference numeral 110).

Of course, the processing system 100 may also include other elements (not shown), as readily contemplated by one of skill in the art, as well as omit certain elements. For example, various other input devices and/or output devices can be included in processing system 100, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized as readily appreciated by one of ordinary skill in the art. Further, in another embodiment, a cloud configuration can be used (e.g., see FIGS. 9-10). These and other variations of the processing system 100 are readily contemplated by one of ordinary skill in the art given the teachings of the present invention provided herein.

Moreover, it is to be appreciated that various figures as described below with respect to various elements and steps relating to the present invention that may be implemented, in whole or in part, by one or more of the elements of system 100.

A description will now be given regarding two exemplary environments 200 and 300 to which the present invention can be applied, in accordance with various embodiments of the present invention. The environments 200 and 300 are described below with respect to FIGS. 2 and 3, respectively. In further detail, the environment 200 includes a learning-based prediction system operatively coupled to a controlled system, while the environment 300 includes a learning-based prediction system as part of a controlled system. Moreover, any of environments 200 and 300 can be part of a cloud-based environment (e.g., see FIGS. 7 and 8). These and other environments to which the present invention can be applied are readily determined by one of ordinary skill in the art, given the teachings of the present invention provided herein, while maintaining the spirit of the present invention.

Figure 2:
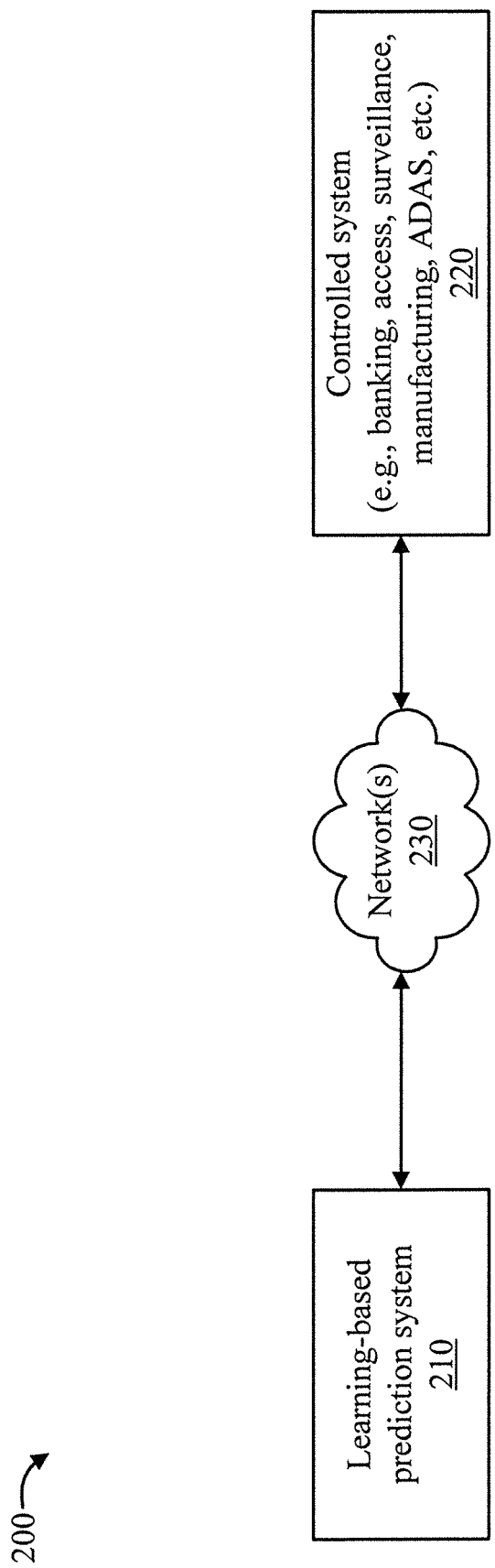
FIG. 2 is a block diagram showing an exemplary environment to which the present invention can be applied, in accordance with an embodiment of the present invention.

FIG. 2 is a block diagram showing an exemplary environment 200 to which the present invention can be applied, in accordance with an embodiment of the present invention.

The environment 200 includes a learning-based prediction system 210 and a controlled system 220. The learning-based prediction system 210 and the controlled system 220 are configured to enable communications therebetween. For example, transceivers and/or other types of communication devices including wireless, wired, and combinations thereof can be used. In an embodiment, communication between the learning-based prediction system 210 and the controlled system 220 can be performed over one or more networks, collectively denoted by the figure reference numeral 230. The communication can include, but is not limited to, multi-variate time series data from the controlled system 220, and forecasts and action initiation control signals from the learning-based prediction system 210. The controlled system 220 can be any type of processor-based system such as, for example, but not limited to, a banking system, an access system, a surveillance system, a manufacturing system (e.g., an assembly line), an Advanced Driver-Assistance System (ADAS), and so forth.

The controlled system 220 provides data (e.g., multi-variate time-series data) to the learning-based prediction system 210 which uses the data to make predictions.

In an embodiment, in order to make a prediction, the learning-based prediction system 210 can use neuromorphic circuit as described herein.

The controlled system 220 can be controlled based on a prediction generated by the learning-based prediction system 210. For example, based on a prediction that a machine will fail in x time steps, a corresponding action (e.g., power down machine, enable machine safeguard to prevent injury/ etc., and/or so forth) can be performed at t<x in order to avoid the failure from actually occurring. As another example, based on a trajectory prediction of an intruder, a surveillance system being controlled could lock or unlock one or more doors in order to secure someone in a certain place (holding area) and/or guide them to a safe place (safe room) and/or restrict them from a restricted place and/or so forth. Verbal (from a speaker) or displayed (on a display device) instructions could be provided along with the locking and/or unlocking of doors (or other actions) in order to guide a person. As a further example, a vehicle can be controlled (braking, steering, accelerating, and so forth) to avoid an obstacle that is predicted to be in a car's way responsive to a prediction. As a yet further example, the present invention can be incorporated into a computer system in order to forecast impending failures and take action before the failures occur, such as switching a component that will soon fail with another component, routing through a different component, processing by a different component, and so forth. It is to be appreciated that the preceding actions are merely illustrative and, thus, other actions can also be performed depending upon the implementation, as readily appreciated by one of ordinary skill in the art given the teachings of the present invention provided herein, while maintaining the spirit of the present invention.

In an embodiment, the learning-based prediction system 210 can be implemented as a node in a cloud-computing arrangement. In an embodiment, a single learning-based prediction system 210 can be assigned to a single controlled system or to multiple controlled systems e.g., different robots in an assembly line, and so forth). These and other configurations of the elements of environment 200 are readily determined by one of ordinary skill in the art given the teachings of the present invention provided herein, while maintaining the spirit of the present invention.

Figure 3:
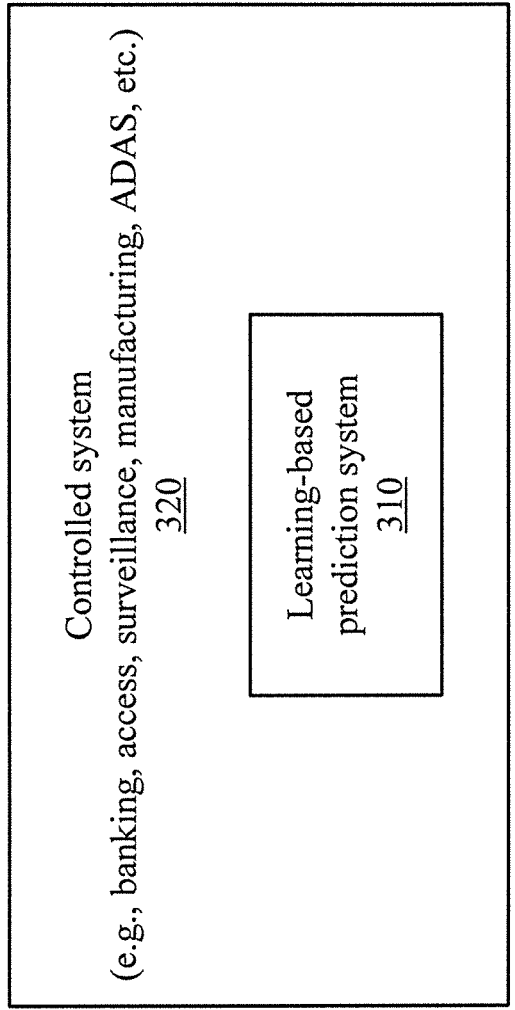
FIG. 3 is a block diagram showing another exemplary environment to which the present invention can be applied, in accordance with an embodiment of the present invention.

FIG. 3 is a block diagram showing another exemplary environment 300 to which the present invention can be applied, in accordance with an embodiment of the present invention.

The environment 300 includes a controlled system 320 that, in turn, includes a learning-based prediction system 310. One or more communication buses and/or other devices can be used to facilitate inter-system, as well as intra-system, communication. The controlled system 320 can be any type of processor-based system such as, for example, but not limited to, a banking system, an access system, a surveillance system, a manufacturing system (e.g., an assembly line), an Advanced Driver-Assistance System (ADAS), and so forth.

Other than system 310 being included in system 320, operations of these elements in environments 200 and 300 are similar. Accordingly, elements 310 and 320 are not described in further detail relative to FIG. 3 for the sake of brevity, with the reader respectively directed to the descriptions of elements 210 and 220 relative to environment 200 of FIG. 2 given the common functions of these elements in the two environments 200 and 300.

Figure 4:
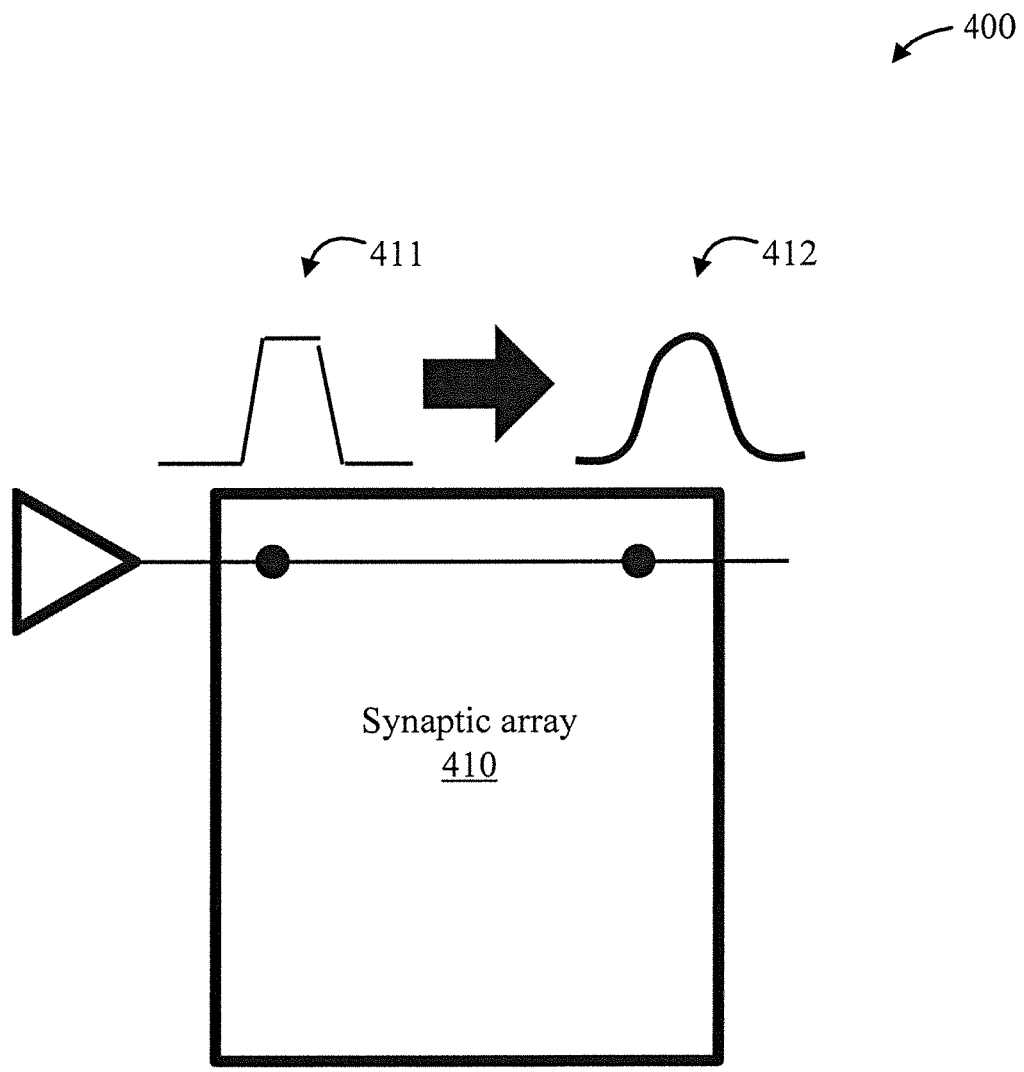
FIG. 4 is a diagram showing an exemplary waveform at a near-end and a far-end of a synaptic array, in accordance with an embodiment of the present invention.

FIG. 4 is a diagram showing an exemplary waveform 400 at a near-end 411 and a far-end 412 of a synaptic array 410, in accordance with an embodiment of the present invention.

The waveform 400 varies in shape at the far-end 412 as compared to the near end 411 of the synaptic array 410. It is this undesirable shape variation that is addressed and overcome by the present invention.

Figure 5:
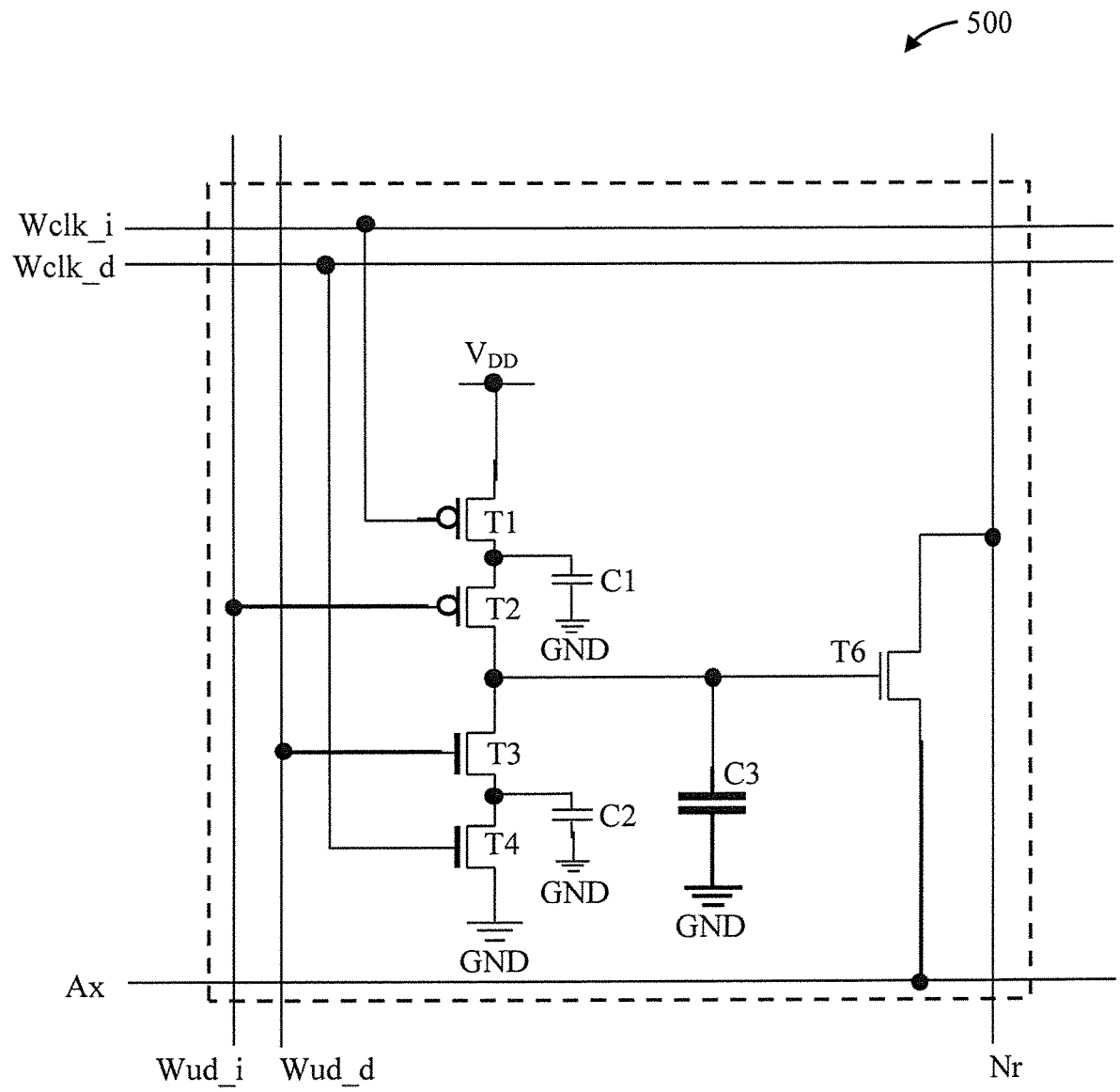
FIG. 5 is a block diagram showing an exemplary neuromorphic cell circuit, in accordance with an embodiment of the present invention.
Figure 6:
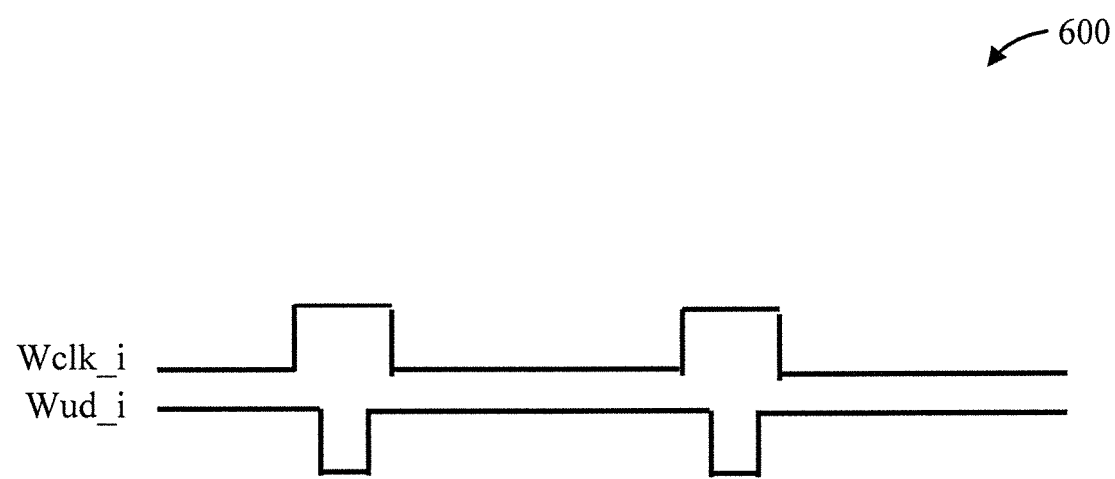
FIG. 6 is a timing diagram showing an exemplary timing relating to the neuromorphic cell circuit of FIG. 5, in accordance with an embodiment of the present invention.
Figure 7:
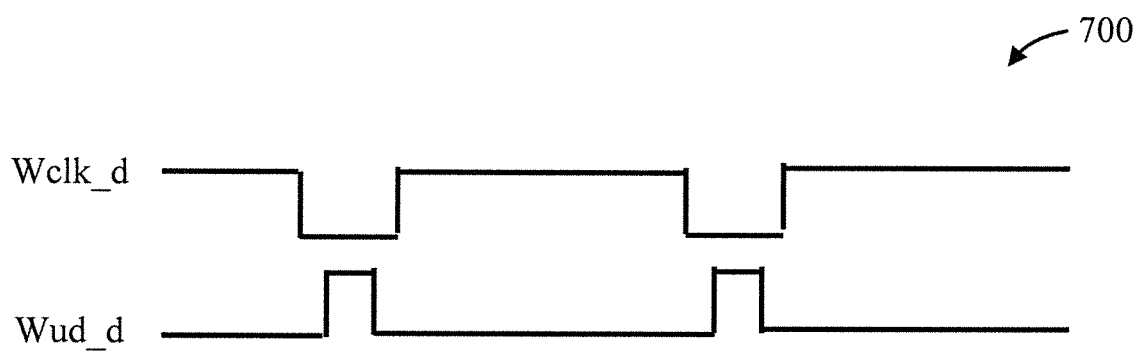
FIG. 7 is a timing diagram showing another exemplary timing relating to the neuromorphic cell circuit of FIG. 5, in accordance with an embodiment of the present invention.

FIG. 5 is a block diagram showing an exemplary neuromorphic cell circuit 500, in accordance with an embodiment of the present invention. FIG. 6 is a timing diagram showing an exemplary timing 600 relating to the neuromorphic cell circuit 500 of FIG. 5, in accordance with an embodiment of the present invention. FIG. 7 is a timing diagram showing another exemplary timing 700 relating to the neuromorphic cell circuit 500 of FIG. 5, in accordance with an embodiment of the present invention.

Referring to FIG. 5, the neuromorphic cell circuit 500 includes two p-type Metal Oxide Semiconductor Field Effect Transistors (MOSFETS), namely T1 and T2.

The neuromorphic cell circuit 500 further includes two n-type MOSFETS, namely T3 and T4.

The neuromorphic cell circuit 500 also includes a CMOS transistor T6.

The neuromorphic cell circuit 500 additionally includes three capacitors, namely C1, C2, and C3. In an embodiment, capacitors C1 and C2 can be MOSFET parasitic capacitances. In another embodiment, capacitors C1 and C2 can be "intentional" CMOS capacitors.

An on-resistance controlled by a gate voltage of T6 is used to update each weight of the crossbar synaptic array cells.

A set of row-lines respectively connect the synaptic array cells in series to a set of pre-synaptic neurons at first ends thereof.

A set of column-lines respectively connect the synaptic array cells in series to a set of post-synaptic neurons at second ends thereof.

The gate voltage of CMOS transistor T6 is updated by performing a charge sharing technique that updates the weights by using non-overlapping pulses. In particular, the charge sharing technique is performed row by row such that the gate voltage is updated linearly in incremental and decremental fashion using non-overlapping pulses for switching vertical and horizontal control lines using different clocks and combinations of the capacitors.

The gate voltage of T6 is updated by using 2 types of charge sharing. FIG. 6 shows one type of charging sharing (incrementing) for updating the gate voltage of T6, and FIG. 7 shows another type of charge sharing (decrementing) for updating the gate voltage of T6.

Referring to FIG. 6, the gate voltage of T6 is updated by using C1 and C3, such that wclk_i and Wud_i are non-overlapping. That is, increment-lines of clock (Wclk_i) for the transistor T1 and update (Wud_i) for the transitory T2.

Referring to FIG. 7, the gate voltage of T6 is updated by using C2 and C3 such that wclk_d and Wud_d are non-overlapping. That is, decrement-lines of clock (Wclk_d) for the transistor T4 and update (Wud_d) for the transistor T3.

Hence, a neuromorphic chip having one or more neuromorphic cells 500 performs the charge sharing technique such that (i) the increment-lines of the clock (Wclk_i) and the increment update (Wud_i) are switched with non-overlapping pulses of the clock and the update is performed in an incremental manner, and (ii) the decrement-lines of the clock (Wclk_d) and the decrement update (Wud_d) are switched with non-overlapping pulses of the clock and the update is performed in a decremental manner.

Figure 8:
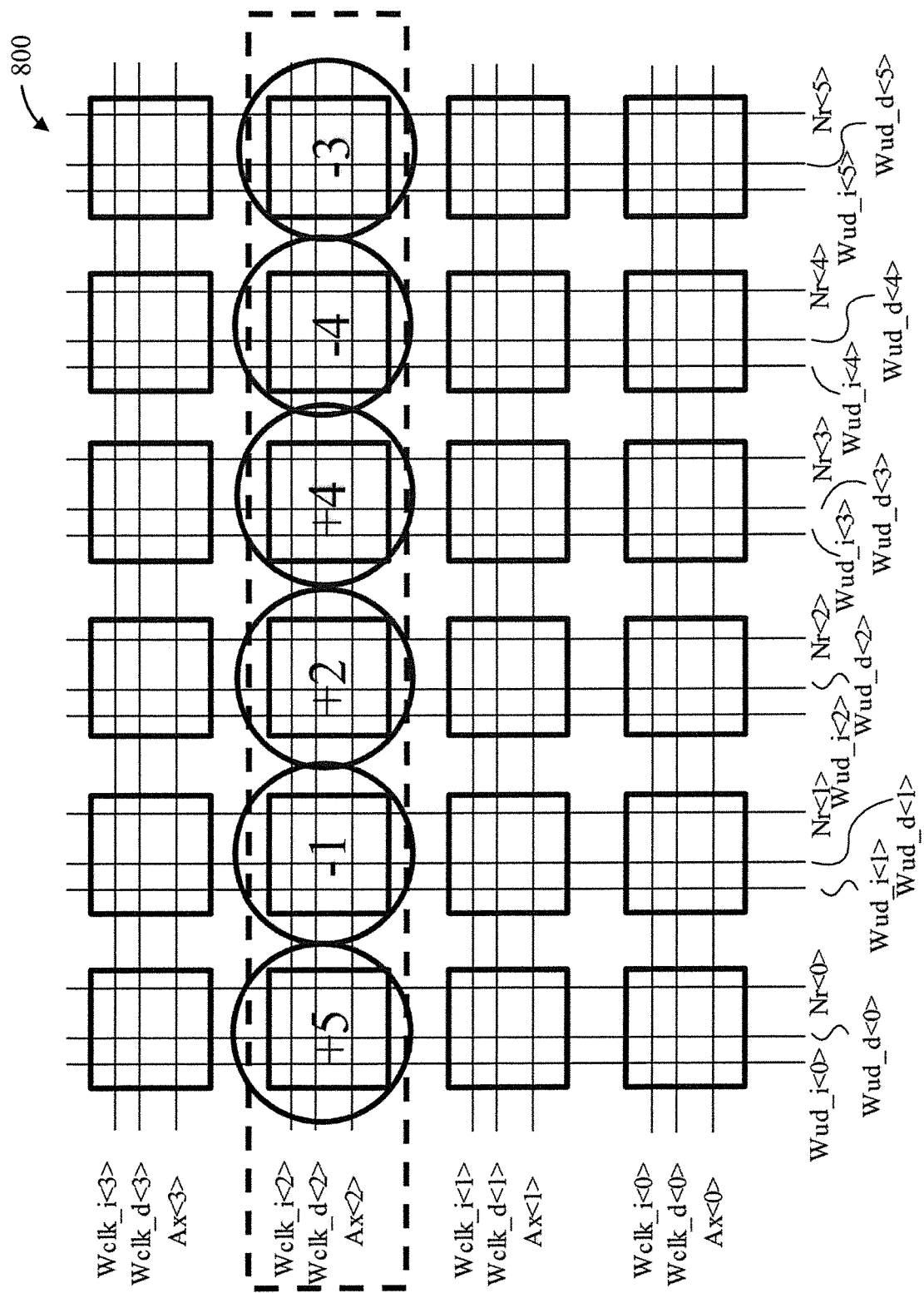
FIG. 8 is a block diagram showing a neuromorphic array formed from multiple neuromorphic circuits of FIG. 5, in accordance with an embodiment of the present invention.
Figure 9:
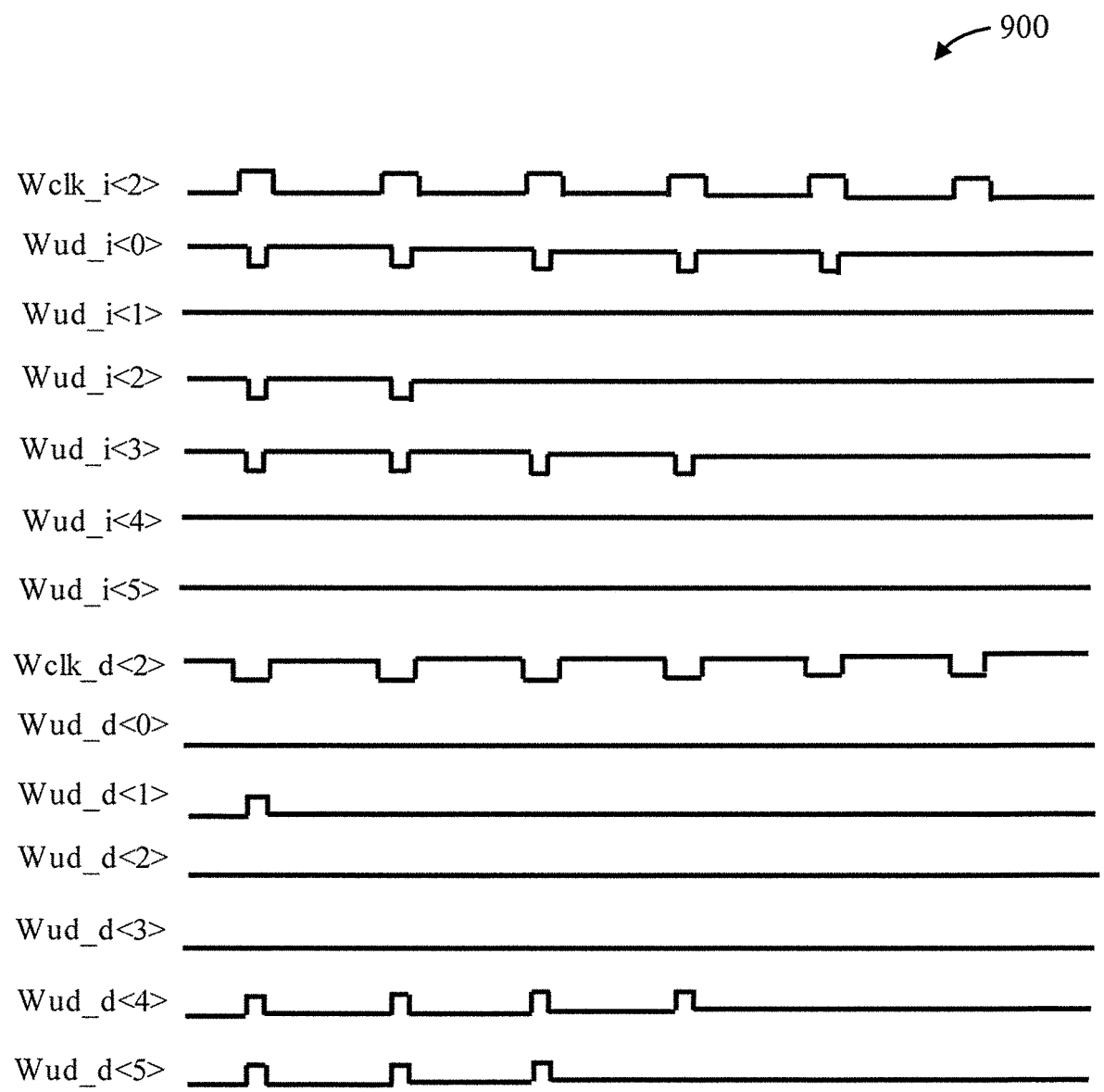
FIG. 9 is a timing diagram showing exemplary pulses applied to the neuromorphic array of FIG. 8, in accordance with an embodiment of the present invention.

FIG. 8 is a block diagram showing a neuromorphic array 800 formed from multiple neuromorphic cell circuits 500 of FIG. 5, in accordance with an embodiment of the present invention. FIG. 9 is a timing diagram showing exemplary pulses 900 applied to the neuromorphic array 800 of FIG. 8, in accordance with an embodiment of the present invention. The neuromorphic array 800 is formed from multiple neuromorphic cells as shown in FIG. 5, where a charge sharing technique is applied such that a row-by-row access scheme is used for weight updating.

Figure 10:
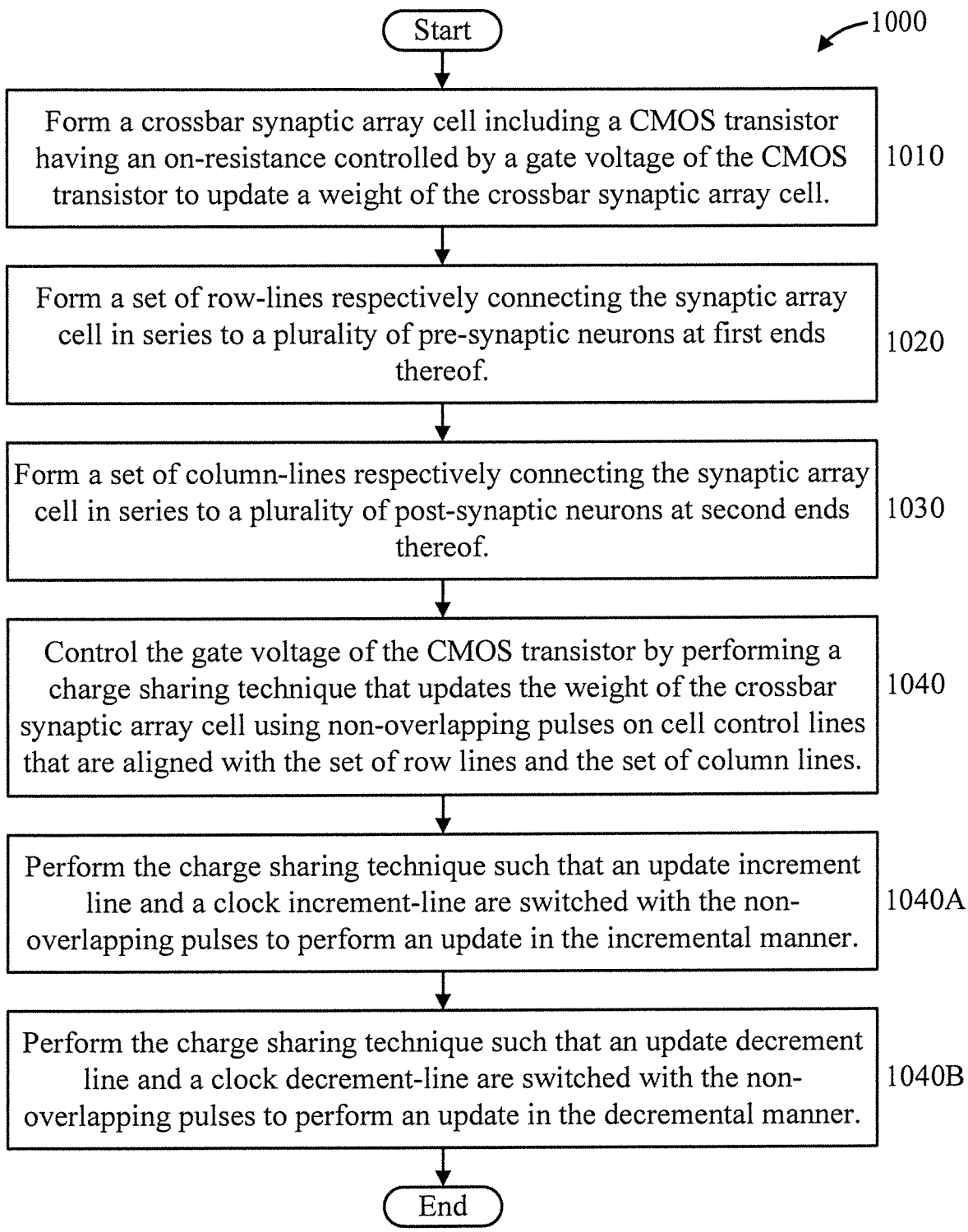
FIG. 10 is a flow diagram showing an exemplary method for linearly weight updateable CMOS synaptic array without cell location dependence, in accordance with an embodiment of the present invention.

FIG. 10 is a flow diagram showing an exemplary method 1000 for linearly weight updateable CMOS synaptic array without cell location dependence, in accordance with an embodiment of the present invention.

At block 1010, form a crossbar synaptic array cell including a CMOS transistor having an on-resistance controlled by a gate voltage of the CMOS transistor to update a weight of the crossbar synaptic array cell.

At block 1020, form a set of row-lines respectively connecting the synaptic array cell in series to a plurality of pre-synaptic neurons at first ends thereof.

At block 1030, form a set of column-lines respectively connecting the synaptic array cell in series to a plurality of post-synaptic neurons at second ends thereof.

At block 1040, control the gate voltage of the CMOS transistor by performing a charge sharing technique that updates the weight of the crossbar synaptic array cell using non-overlapping pulses on cell control lines that are aligned with the set of row lines and the set of column lines.

In an embodiment, block 1040 includes one or more of blocks 1040A and 1040B.

At block 1040A, perform the charge sharing technique such that an update increment line and a clock increment-line are switched with the non-overlapping pulses to perform an update in the incremental manner.

At block 1040B, perform the charge sharing technique such that an update decrement line and a clock decrement-line are switched with the non-overlapping pulses to perform an update in the decremental manner.

It is to be appreciated that any known manufacturing techniques can be used to form a neuromorphic circuit and/or chip in accordance with the teachings of the present invention. Accordingly, the same is not further described herein for the sake of brevity.

It is to be appreciated that the present invention can be included as part of a prediction system. The prediction system can, in turn, be part of another system (e.g., an ADAS). Moreover, at least a portion of the prediction system can be implemented using a cloud configuration, as described in further detail hereinbelow.

FIGS. 11-40 are plots showing exemplary experimental results obtained for a case (hereinafter interchangeably referred to as "Case 1") involving 128 cell loads. Some of the plots show experimental results of the prior art (Case 1-PA), and other ones of the plots show experimental results in accordance with the present invention (Case 1-PI). The experimental results of the prior art relate to the use of a memory cell formed from a 3T1C cell.

In particular, FIGS. 11-25 relate to incrementing the gate voltage of transistor T6, while FIGS. 26-40 relate to decrementing the gate voltage of the transistor T6, all in the case involving 128 cell loads. The various pulse widths and currents are described below.

Figure 21:
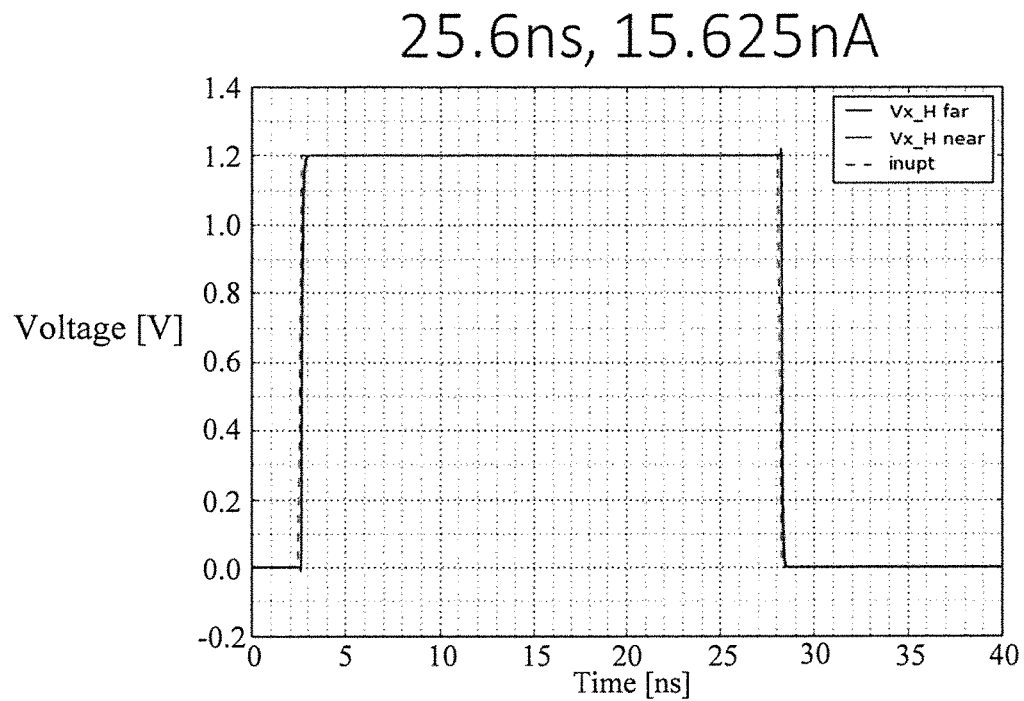
FIGS. 21-22 are plots directed to Case 1-PA, incrementing the gate voltage of transistor T6, and the use of a pulse having a 25.6 ns width at 15.625 nA.
Figure 22:
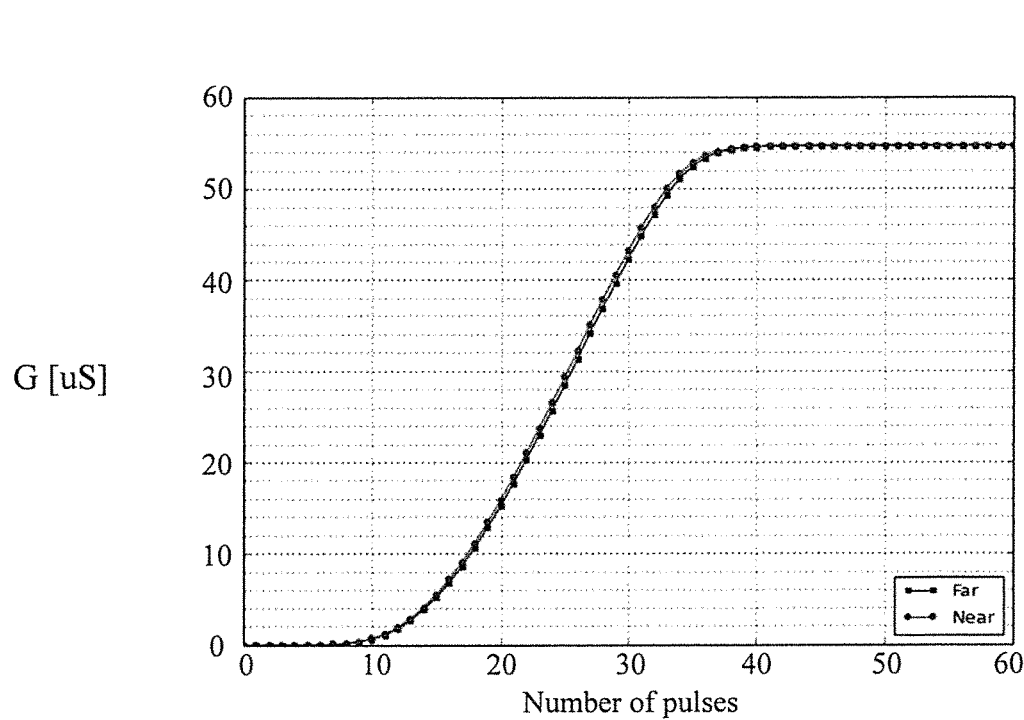
Figure 23:
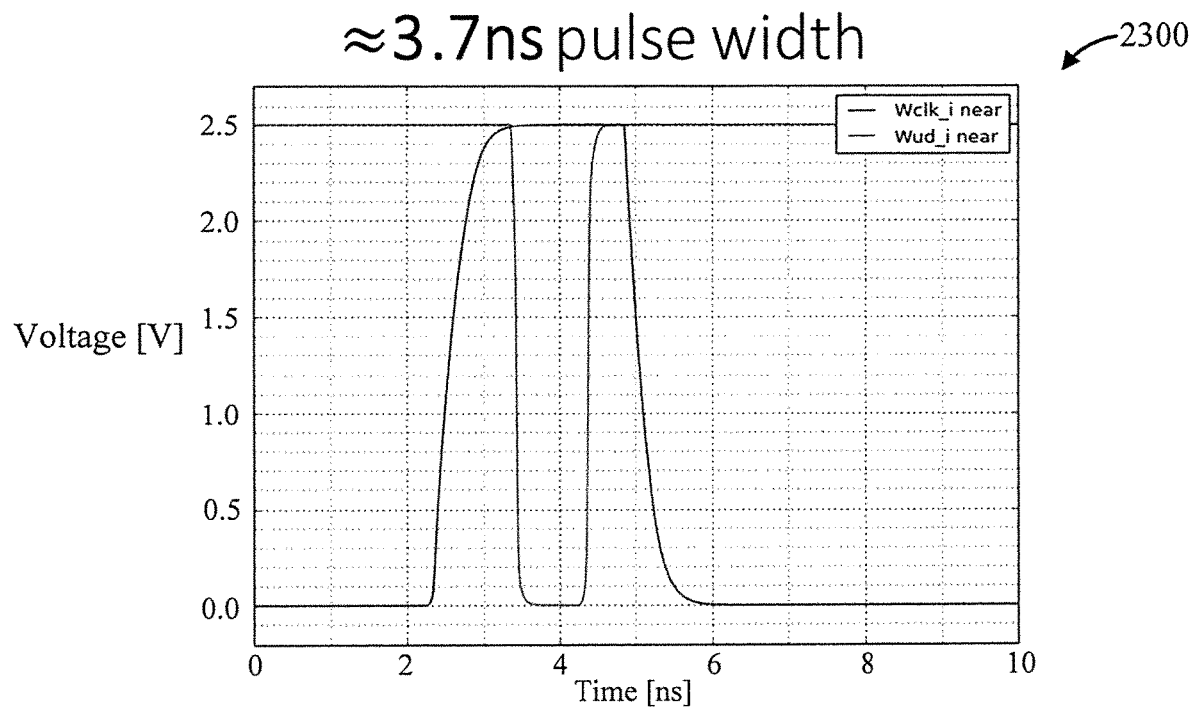
FIGS. 23-25 are plots directed to Case 1-PI, incrementing the gate voltage of transistor T6, and the use of a pulse having a 1.3 ns width.
Figure 24:
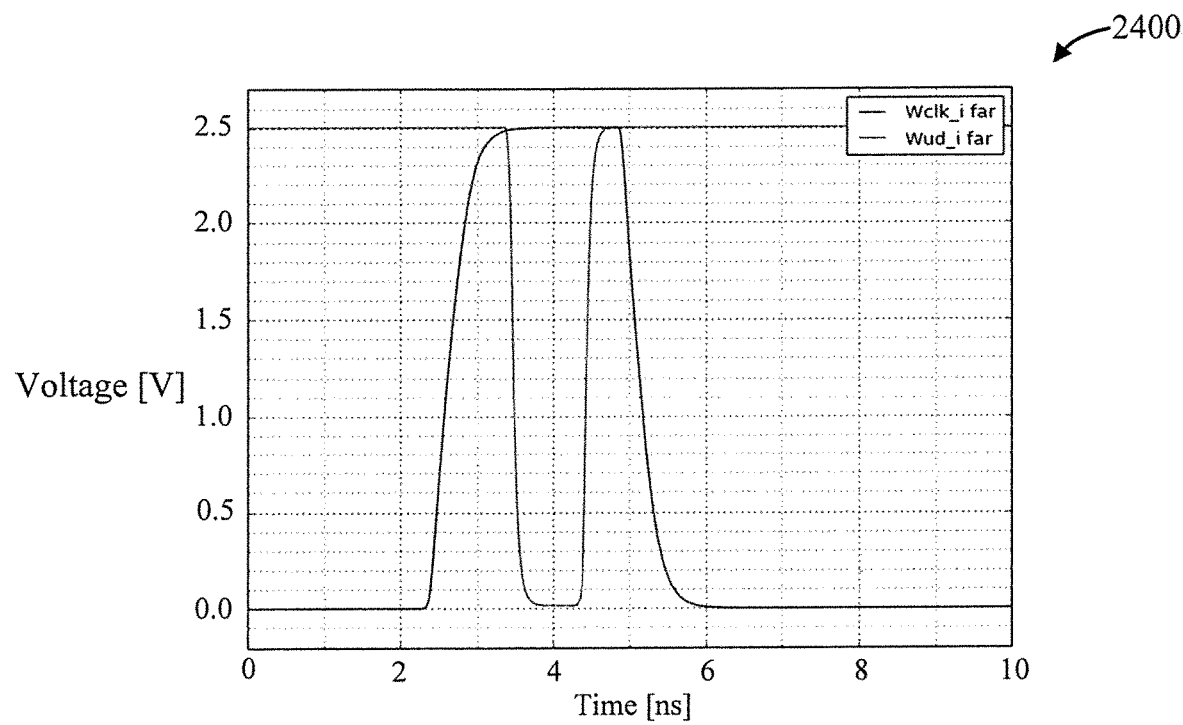
Figure 25:
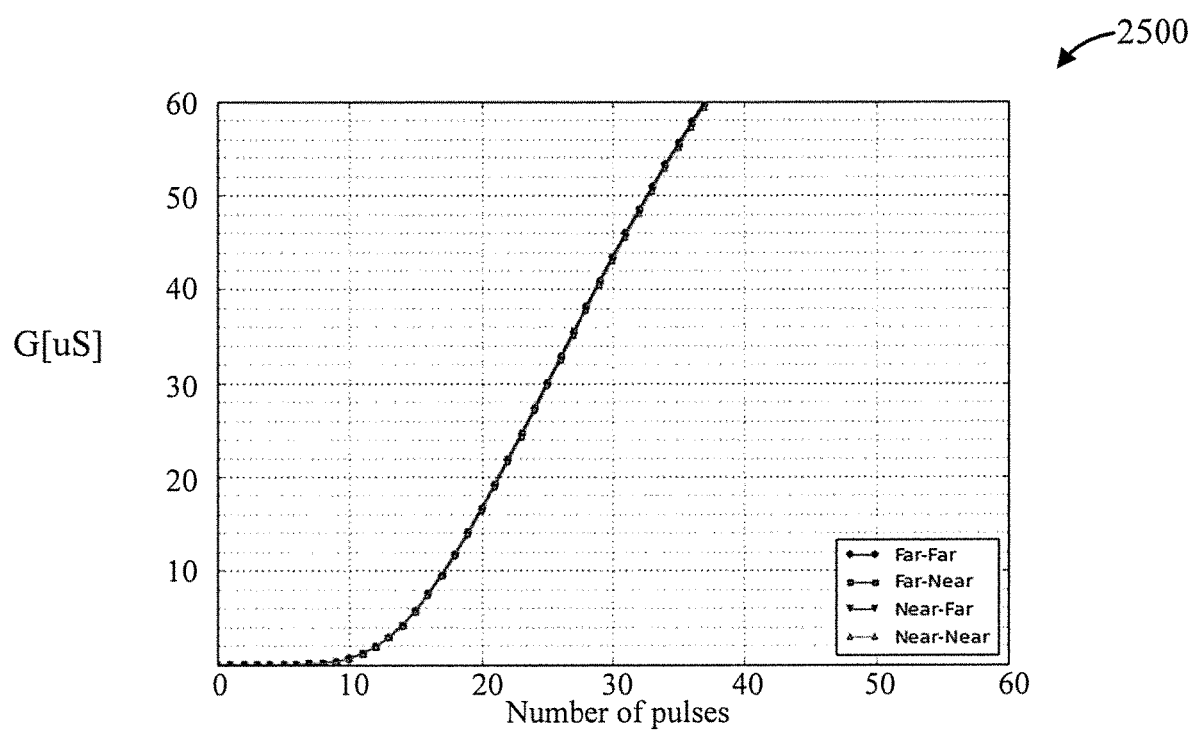

A key point to be noted here is that the difference of the weight update characteristic on the near-end and the far-end is significant if we use a shorter pulse. It can be mitigated by using a wider pulse in the prior technique. However, the PA case needs at least around a 25.6 ns pulse width in order to minimize the difference as shown in FIGS. 21-22. In contrast, using the present invention, it can be achieved by using a 3.2 ns pulse width as shown in FIGS. 23-25. Thus, the present invention enables fast operation that the prior art (PA) case. The improvement is more prominent in larger arrays. FIGS. 26-40 show similar results for the decrement case.

Figure 11:
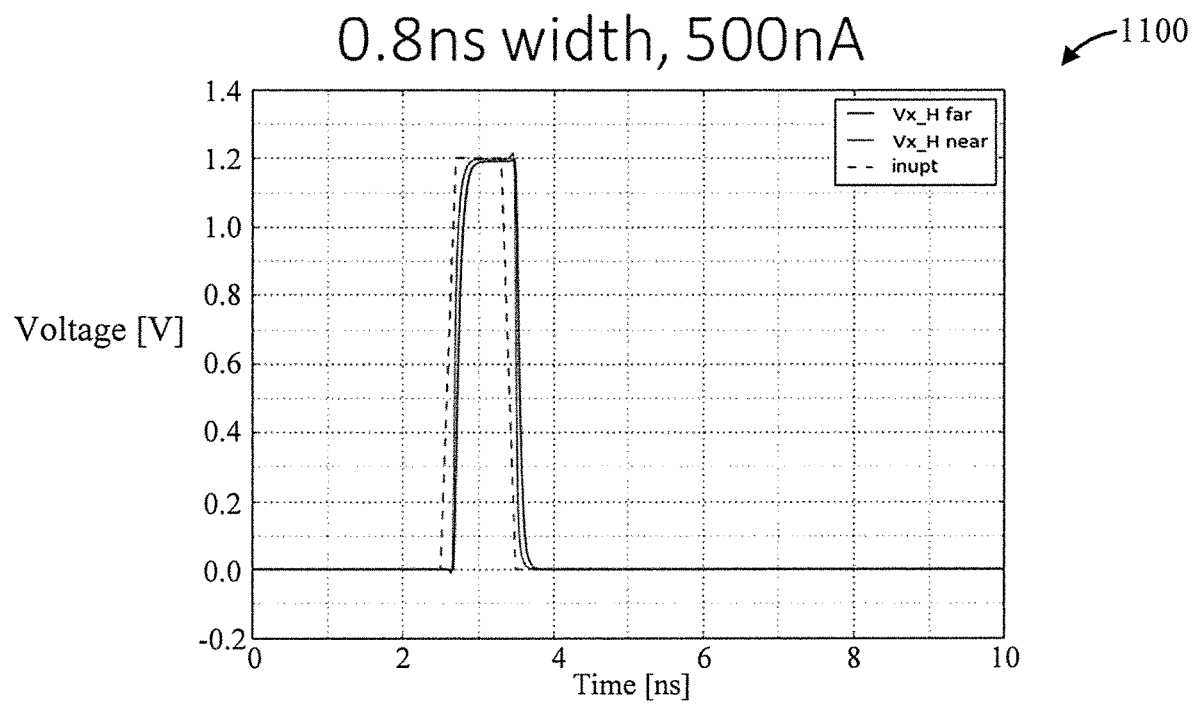
FIGS. 11-12 are plots directed to Case1-PA, incrementing the gate voltage of transistor T6, and the use of a pulse having a 0.8 ns width at 500 nA.
Figure 12:
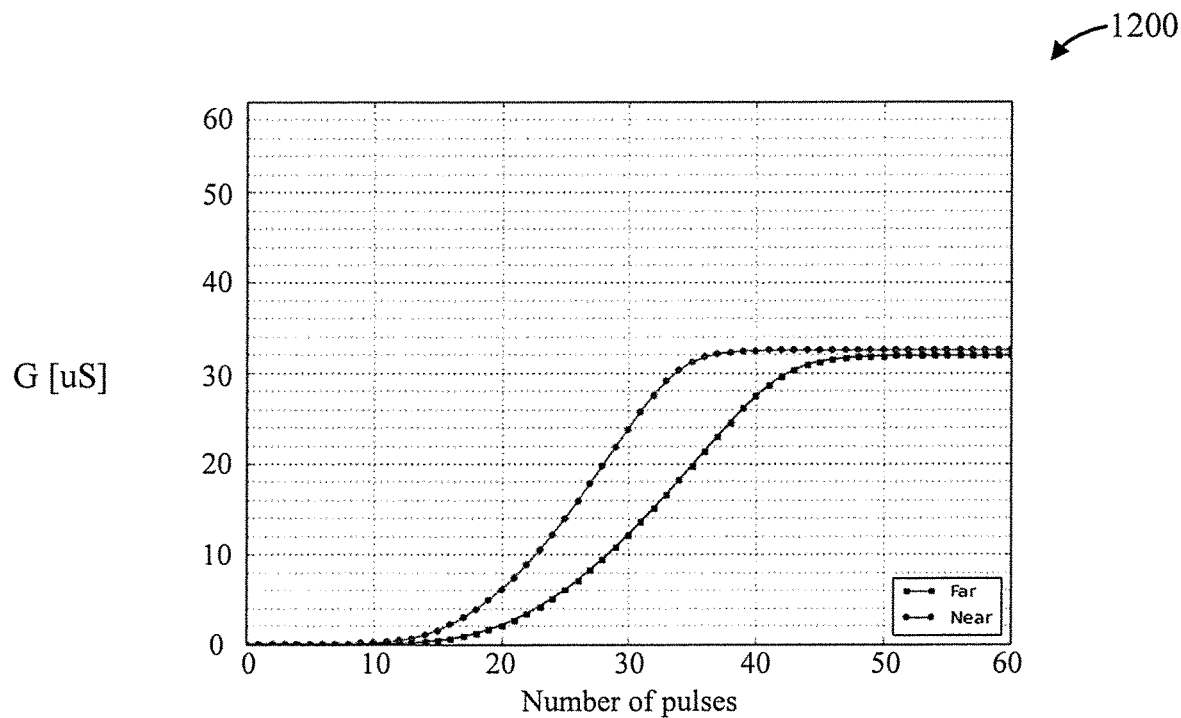

Referring to FIGS. 11-12 (plots 1100 and 1200, respectively), the same are directed to Case 1-PA and the use of a pulse having a 0.8 ns width at 500 nA.

Figure 13:
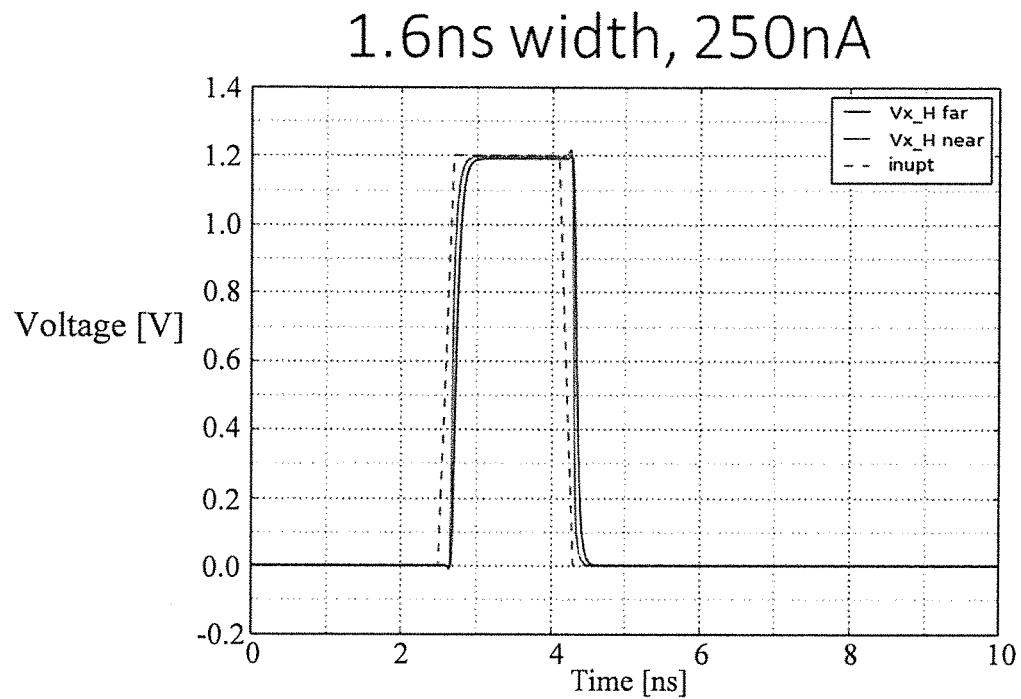
FIGS. 13-14 are plots directed to Case 1-PA, incrementing the gate voltage of transistor T6, and the use of a pulse having a 1.6 ns width at 250 nA.
Figure 14:
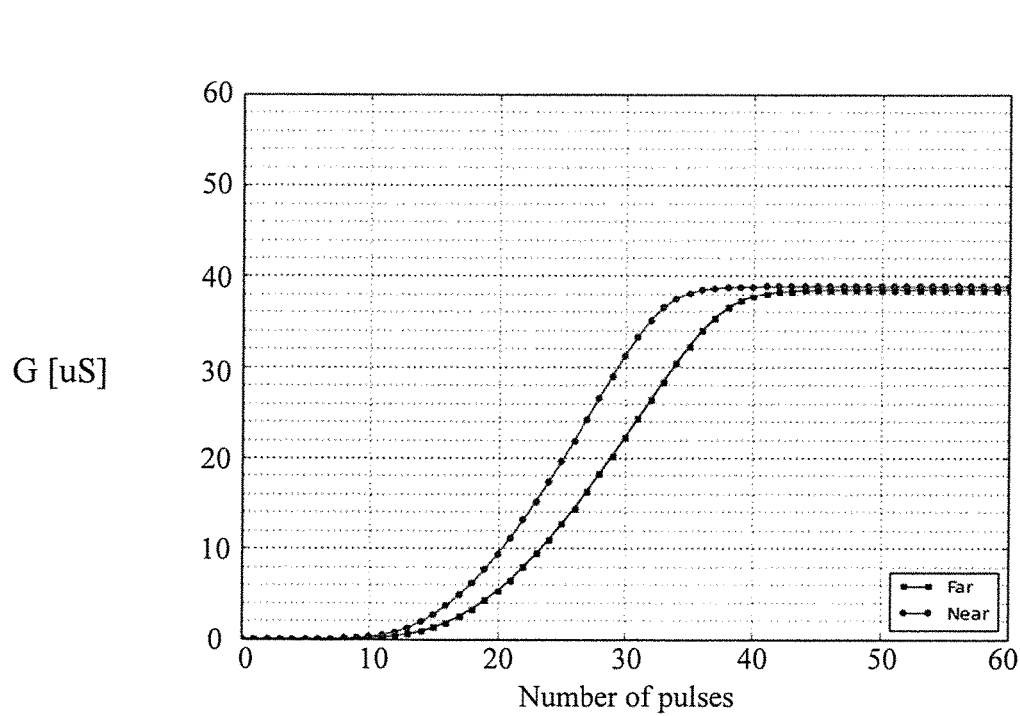

Referring to FIGS. 13-14 (plots 1300 and 1400, respectively), the same are directed to Case 1-PA and the use of a pulse having a 1.6 ns width at 250 nA.

Figure 15:
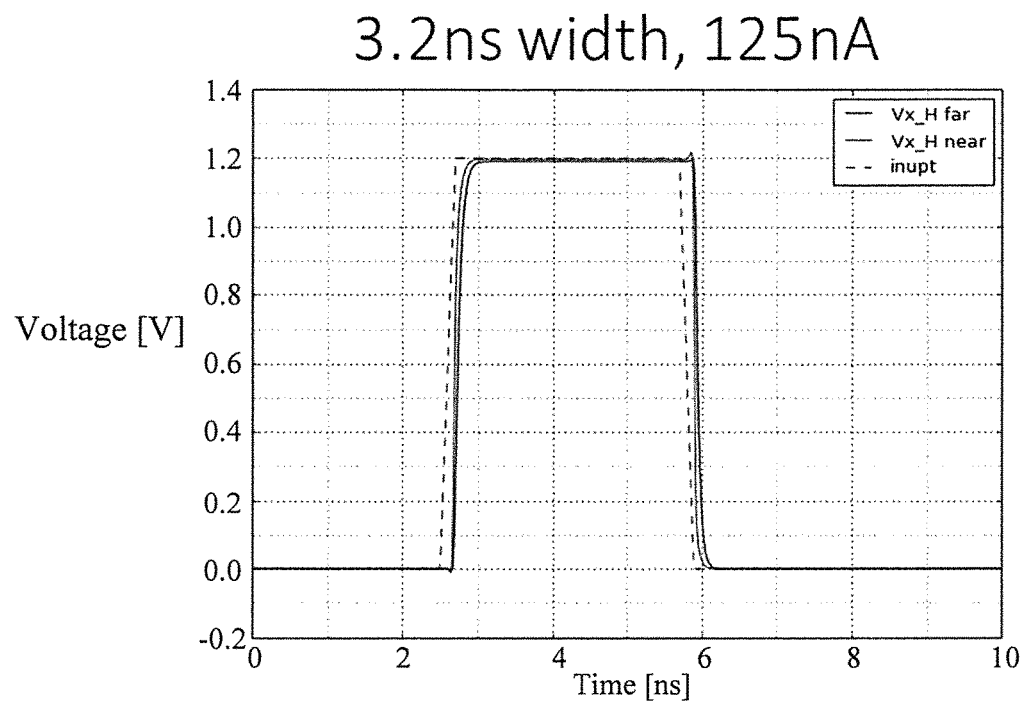
FIGS. 15-16 are plots directed to Case 1-PA, incrementing the gate voltage of transistor T6, and the use of a pulse having a 3.2 ns width at 125 nA.
Figure 16:
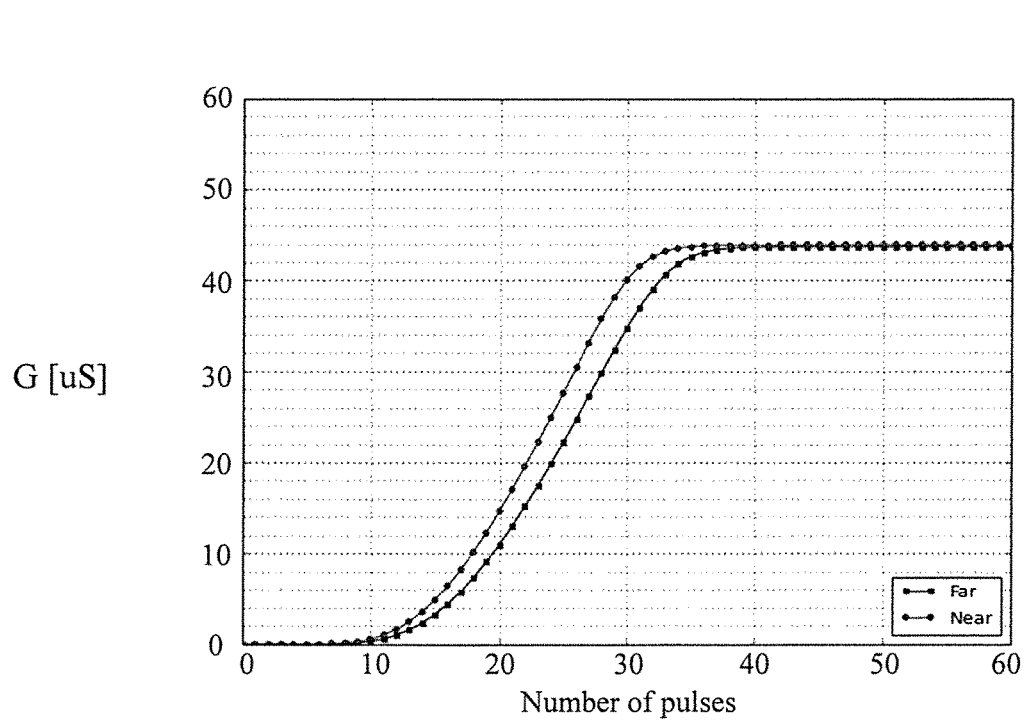

Referring to FIGS. 15-16 (plots 1500 and 1600, respectively), the same are directed to Case 1-PA and the use of a pulse having a 3.2 ns width at 125 nA.

Figure 17:
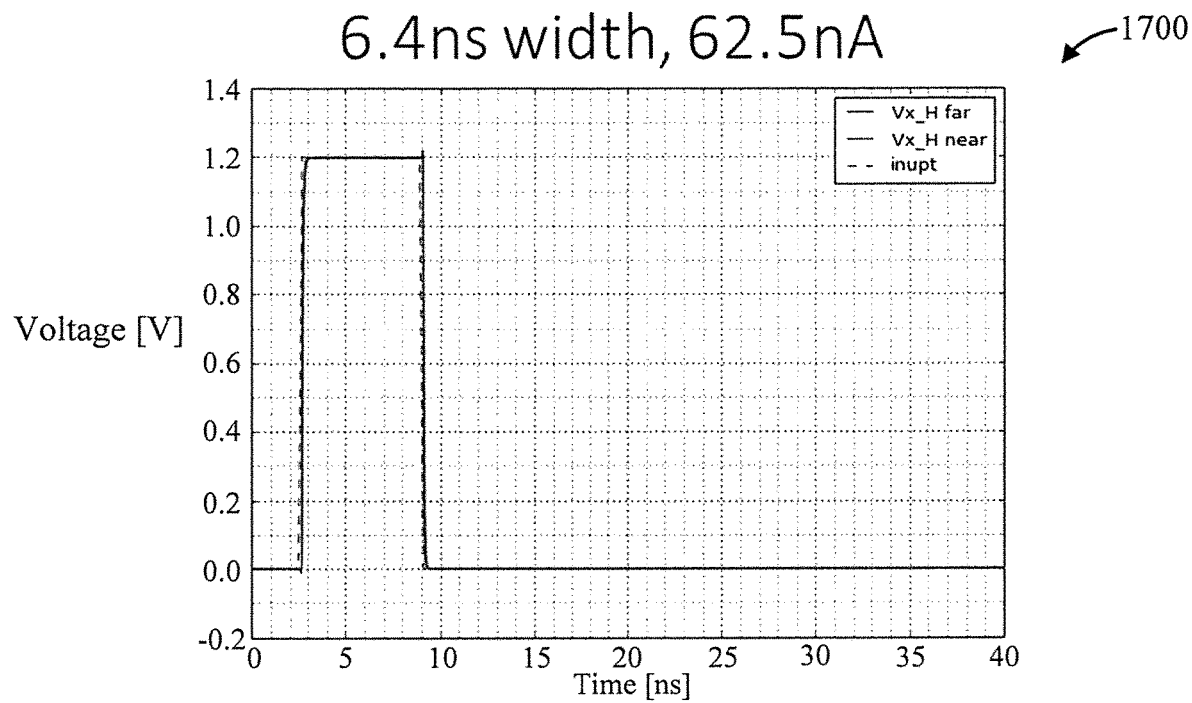
FIGS. 17-18 are plots directed to Case 1-PA, incrementing the gate voltage of transistor T6, and the use of a pulse having 6.4 ns width at 62.5 nA.
Figure 18:
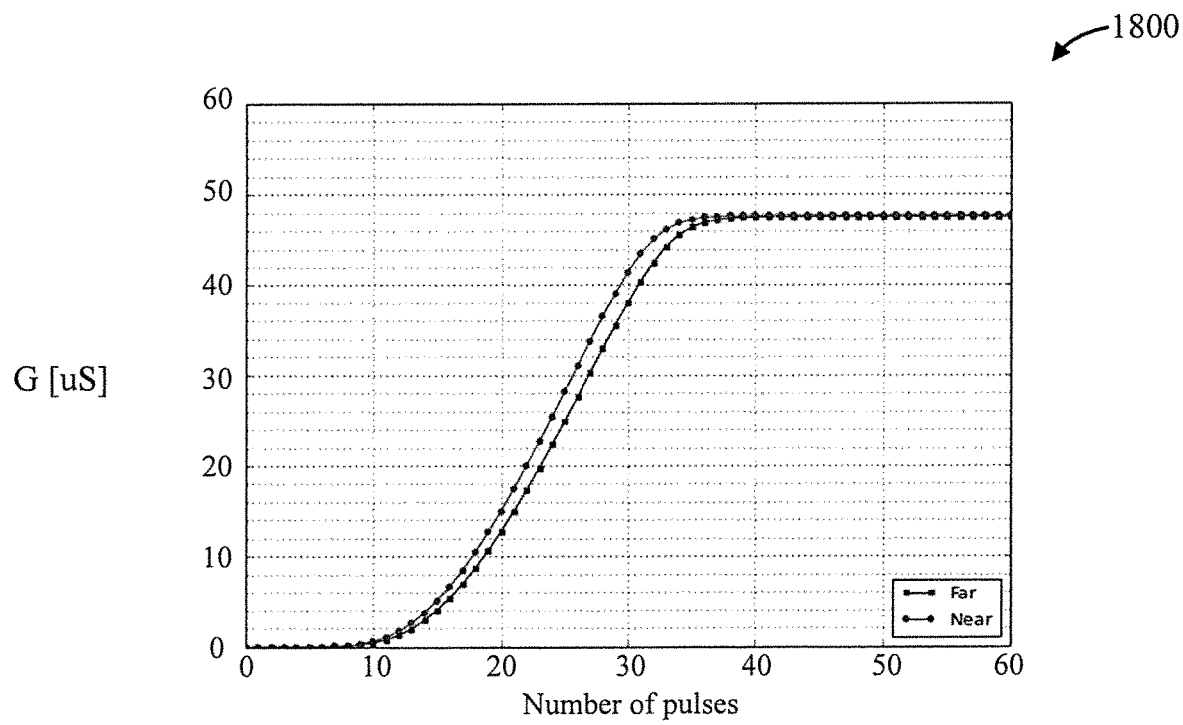
Figure 19:
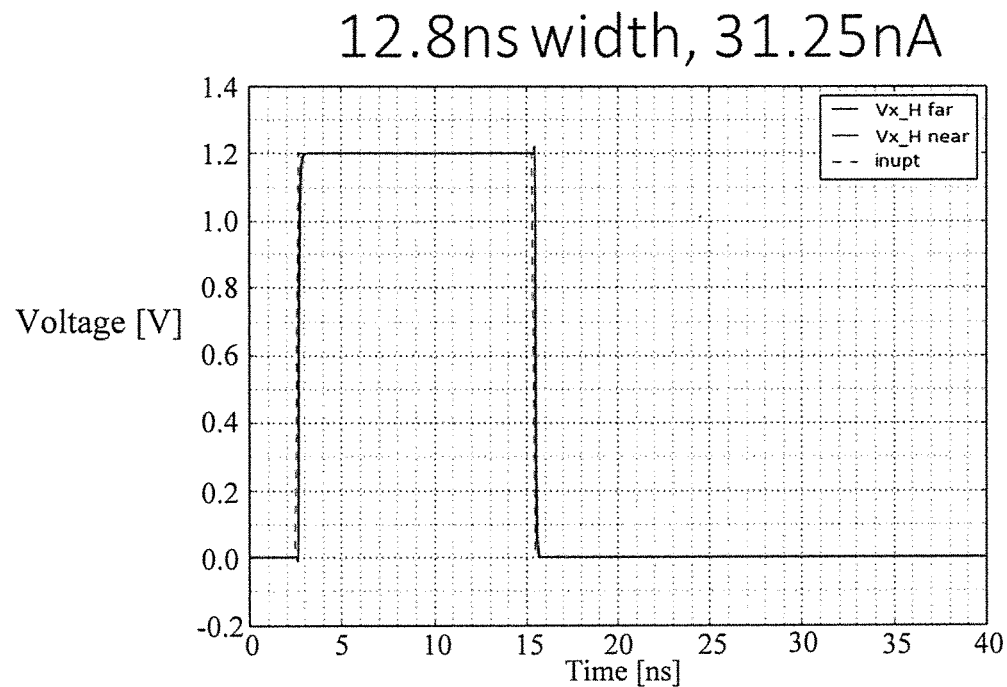
FIGS. 19-20 are plots directed to Case 1-PA, incrementing the gate voltage of transistor T6, and the use of a pulse having a 12.8 ns width at 31.25 nA.
Figure 20:
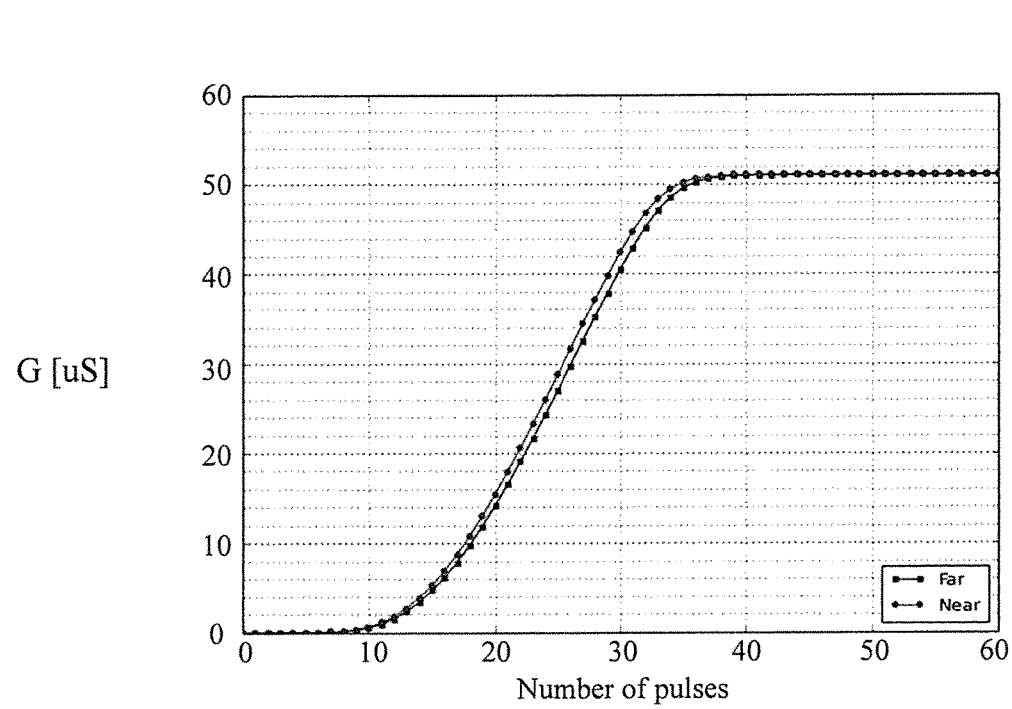

Referring to FIGS. 17-18 (plots 1700 and 1800, respectively), the same are directed to Case 1-PA and the use of a pulse having 6.4 ns width at 62.5 nA Referring to FIGS. 19-20 (plots 1900 and 2000, respectively), the same are directed to Case 1-PA and the use of a pulse having a 12.8 ns width at 31.25 nA.

Referring to FIGS. 21-22 (plots 2100 and 2200, respectively), the same are directed to Case 1-PA and the use of a pulse having a 25.6 ns width at 15.625 nA.

Referring to FIGS. 23-25 (plots 2300, 2400, and 2500, respectively), the same are directed to Case 1-PI and the use of a pulse having a 3.7 ns width.

Figure 26:
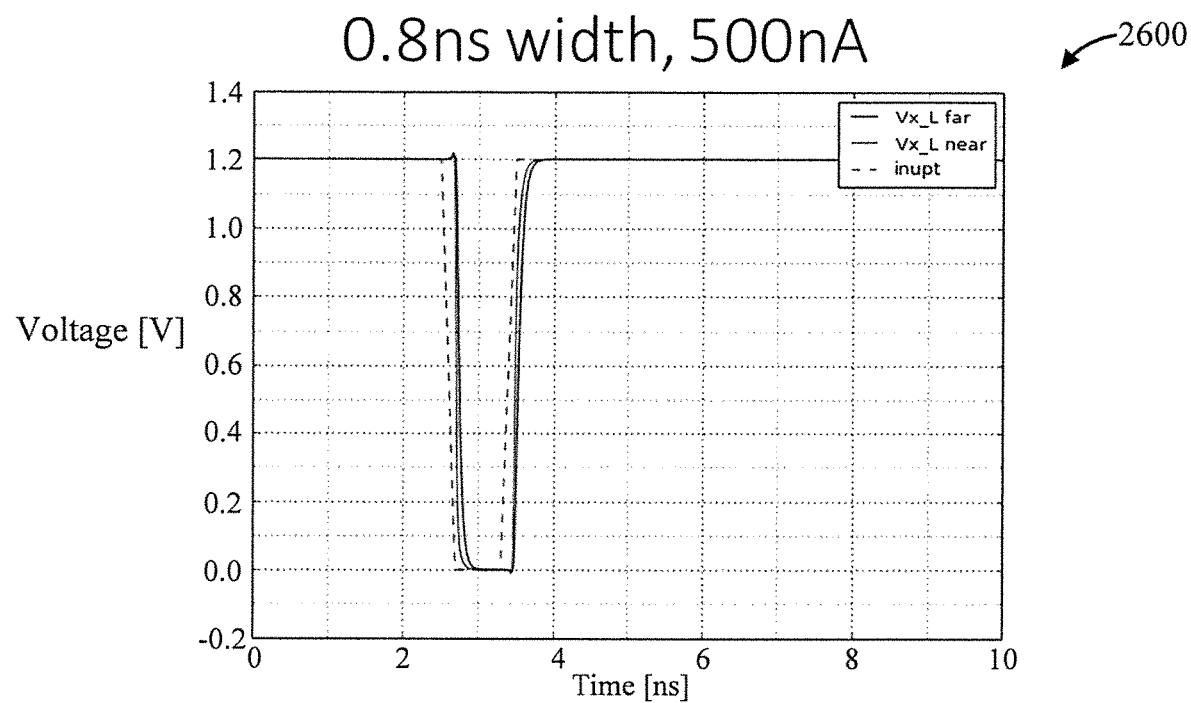
FIGS. 26-27 are plots directed to Case 1-PA, decrementing the gate voltage of transistor T6, and the use of a pulse having a 0.8 ns width at 500 nA.
Figure 27:
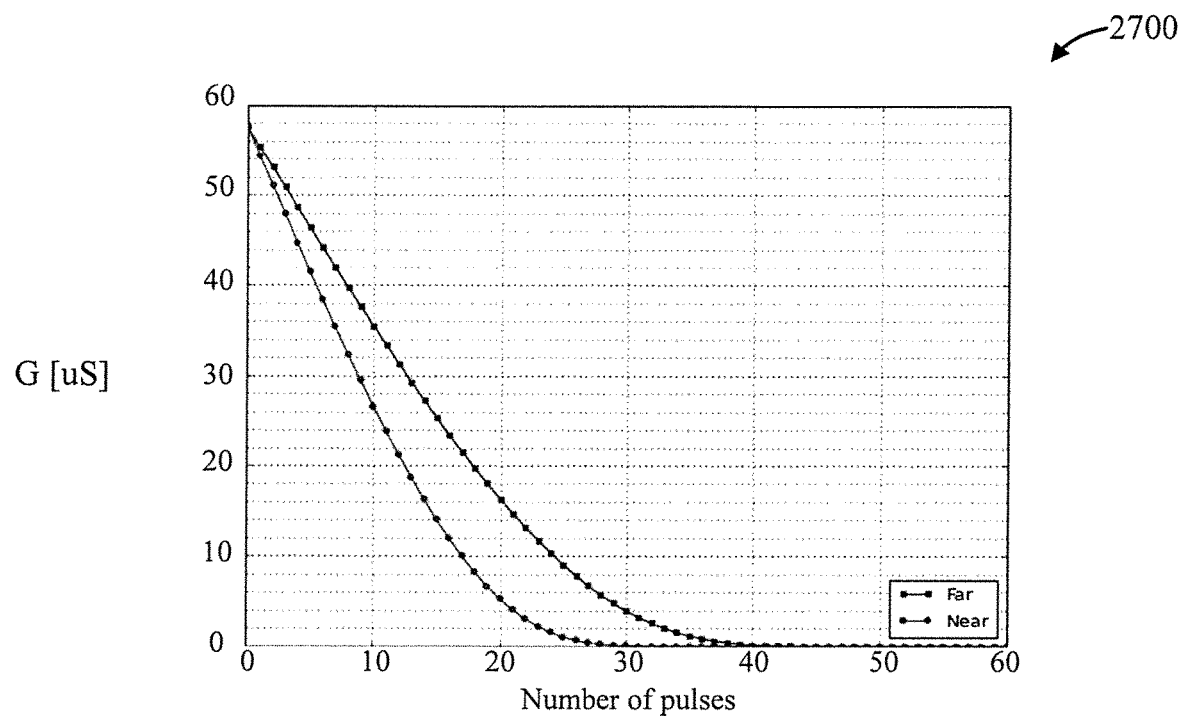

Referring to FIGS. 26-27 (plots 2600 and 2700, respectively), the same are directed to Case 1-PA and the use of a pulse having a 0.8 ns width at 500 nA.

Figure 28:
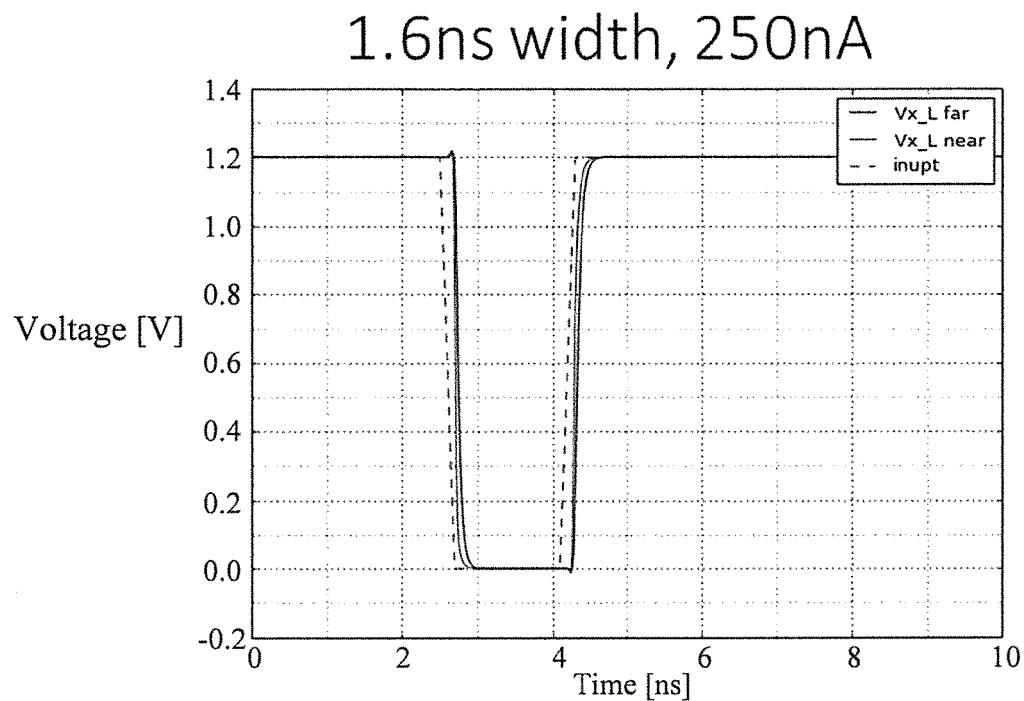
FIGS. 28-29 are plots directed to Case 1-PA, decrementing the gate voltage of transistor T6, and the use of a pulse having a 1.6 ns width at 250 nA.
Figure 29:
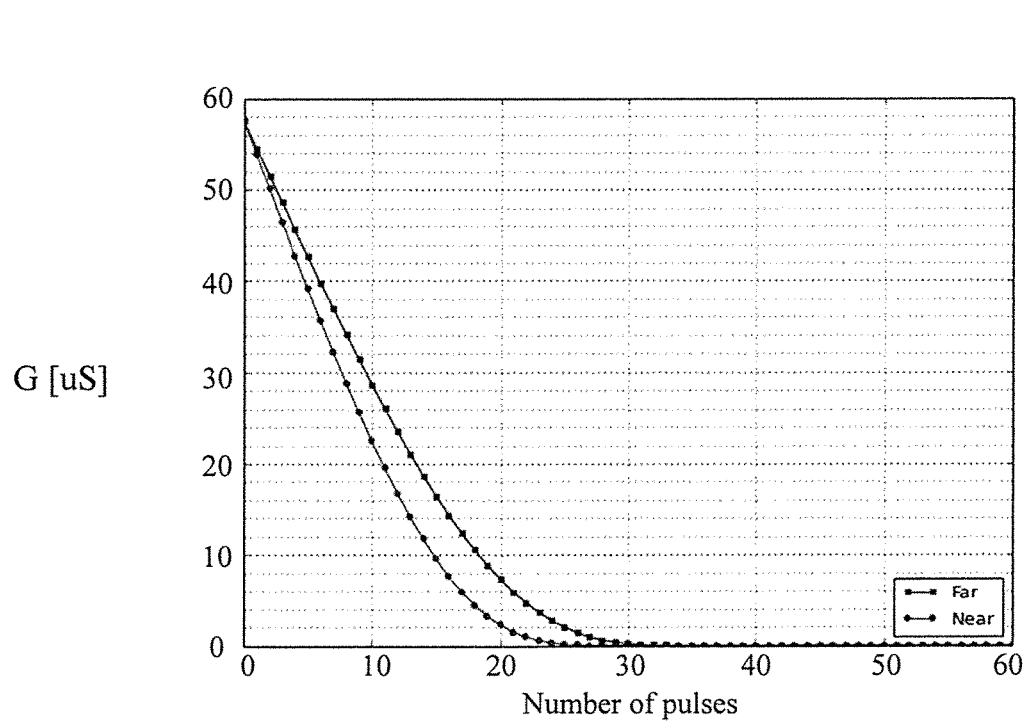

Referring to FIGS. 28-29 (plots 2800 and 2900, respectively), the same are directed to Case 1-PA and the use of a pulse having a 1.6 ns width at 250 nA.

Figure 30:
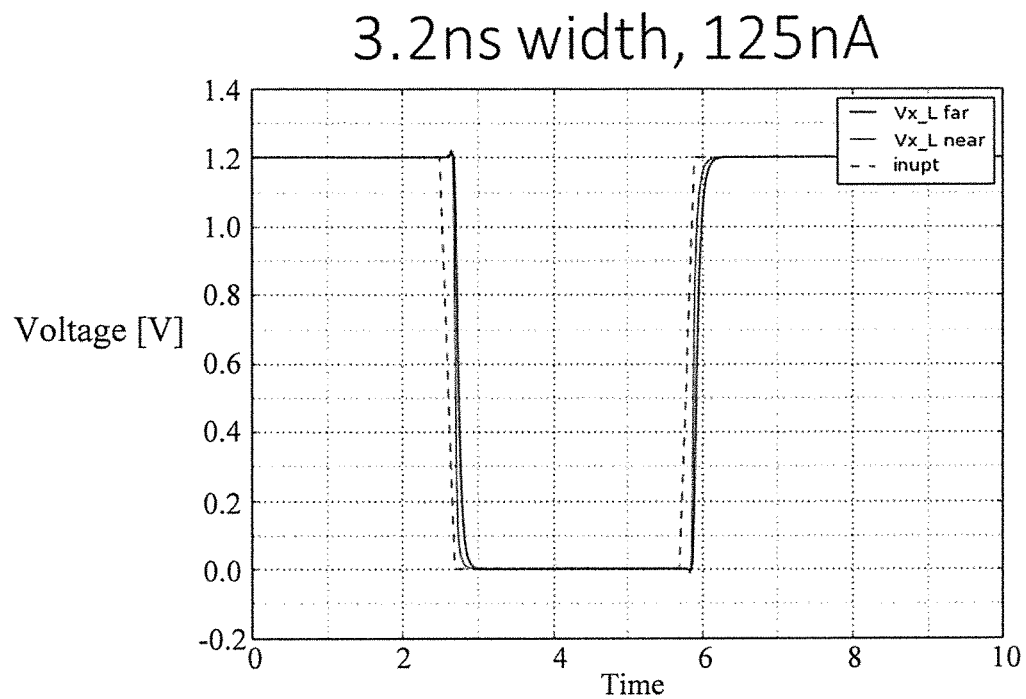
FIGS. 30-31 are plots directed to Case 1-PA, decrementing the gate voltage of transistor T6, and the use of a pulse having a 3.2 ns width at 125 nA.
Figure 31:
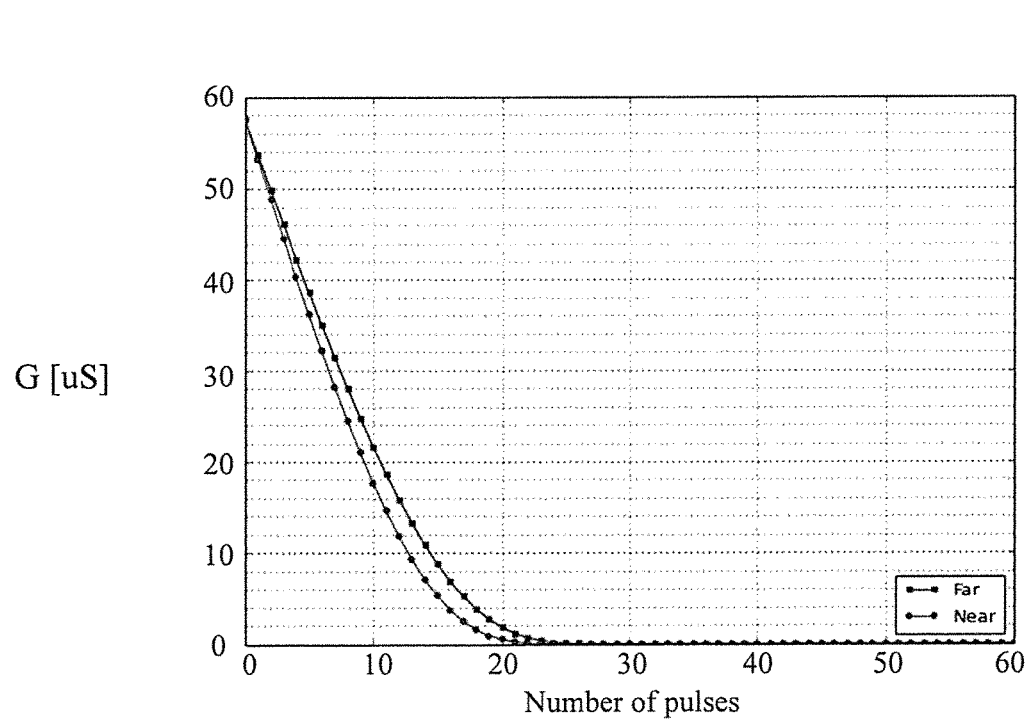

Referring to FIGS. 30-31 (plots 3000 and 3100, respectively), the same are directed to Case 1-PA and the use of a pulse having a 3.2 ns width at 125 nA.

Figure 32:
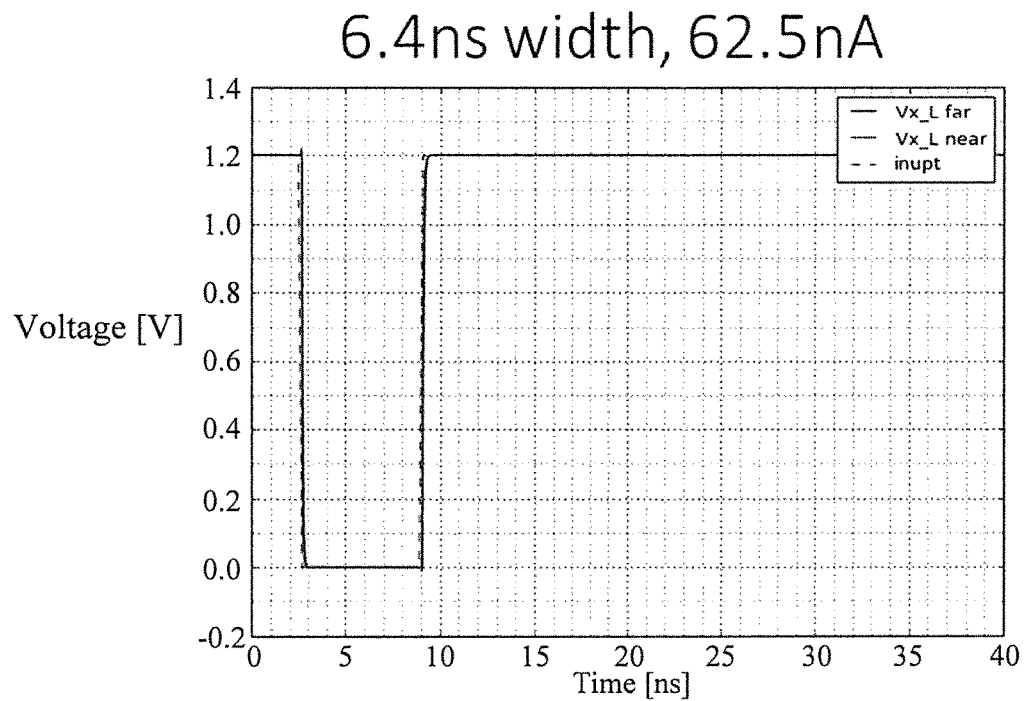
FIGS. 32-33 are plots directed to Case 1-PA, decrementing the gate voltage of transistor T6, and the use of a pulse having 6.4 ns width at 62.5 nA.
Figure 33:
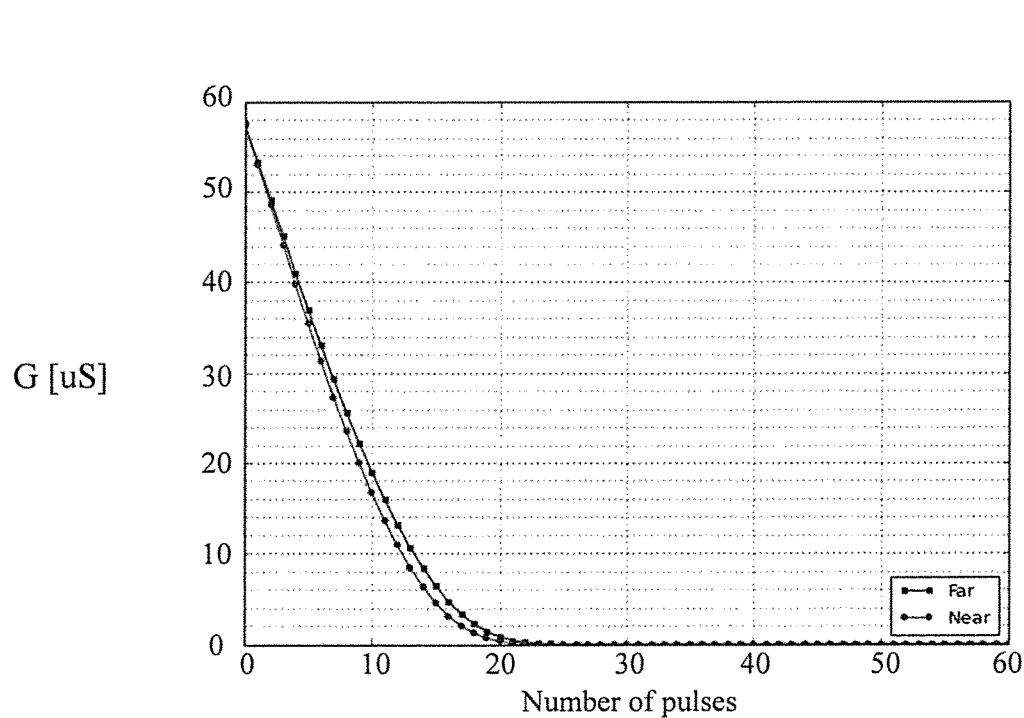
Figure 34:
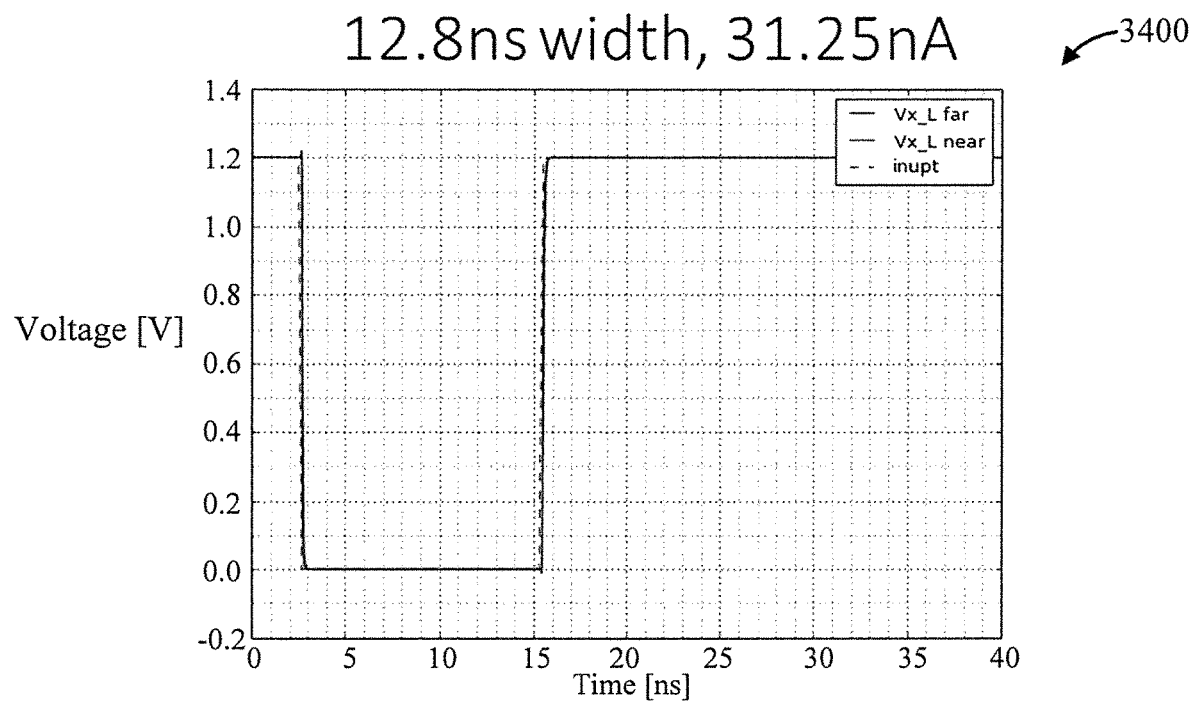
FIGS. 34-35 are plots directed to Case 1-PA, decrementing the gate voltage of transistor T6, and the use of a pulse having a 12.8 ns width at 31.25 nA.
Figure 35:
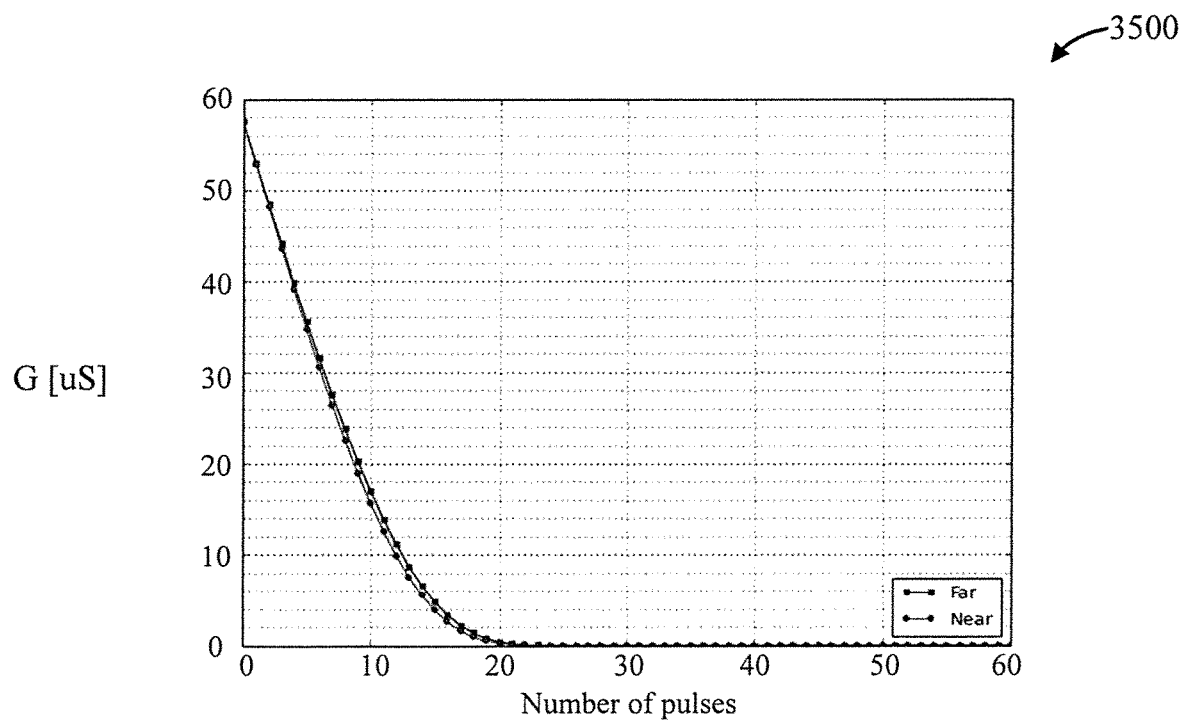

Referring to FIGS. 32-33 (plots 3200 and 3300, respectively), the same are directed to Case 1-PA and the use of a pulse having 6.4 ns width at 62.5 nA Referring to FIGS. 34-35 (plots 3400 and 3500, respectively), the same are directed to Case 1-PA and the use of a pulse having a 12.8 ns width at 31.25 nA.

Figure 36:
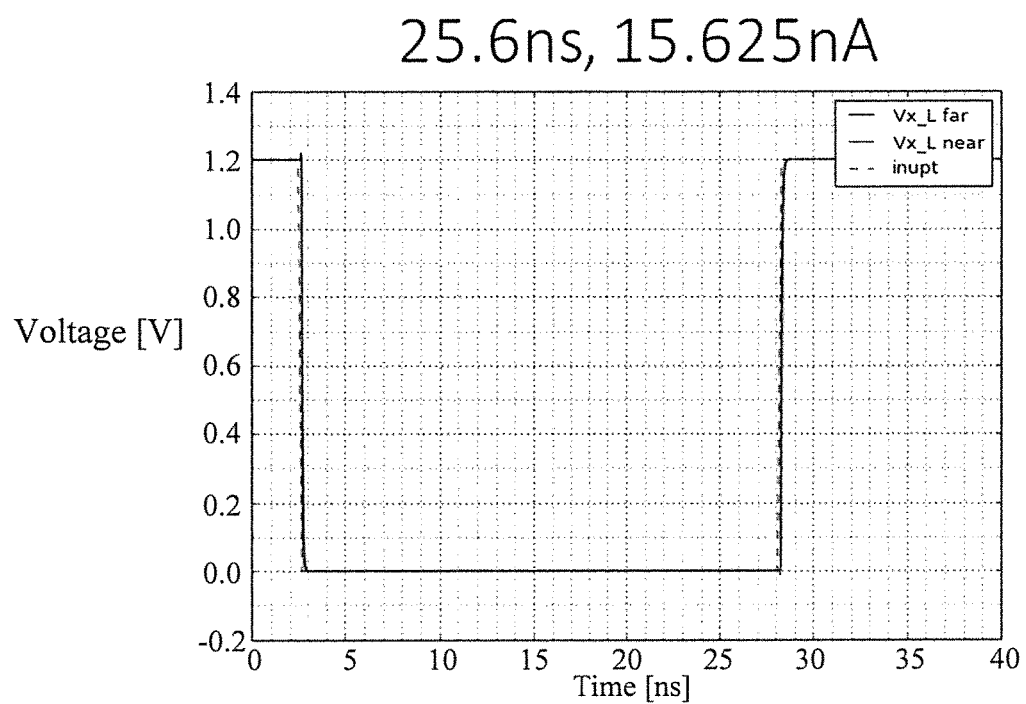
FIGS. 36-37 are plots directed to Case 1-PA, decrementing the gate voltage of transistor T6, and the use of a pulse having a 25.6 ns width at 15.625 nA.
Figure 37:
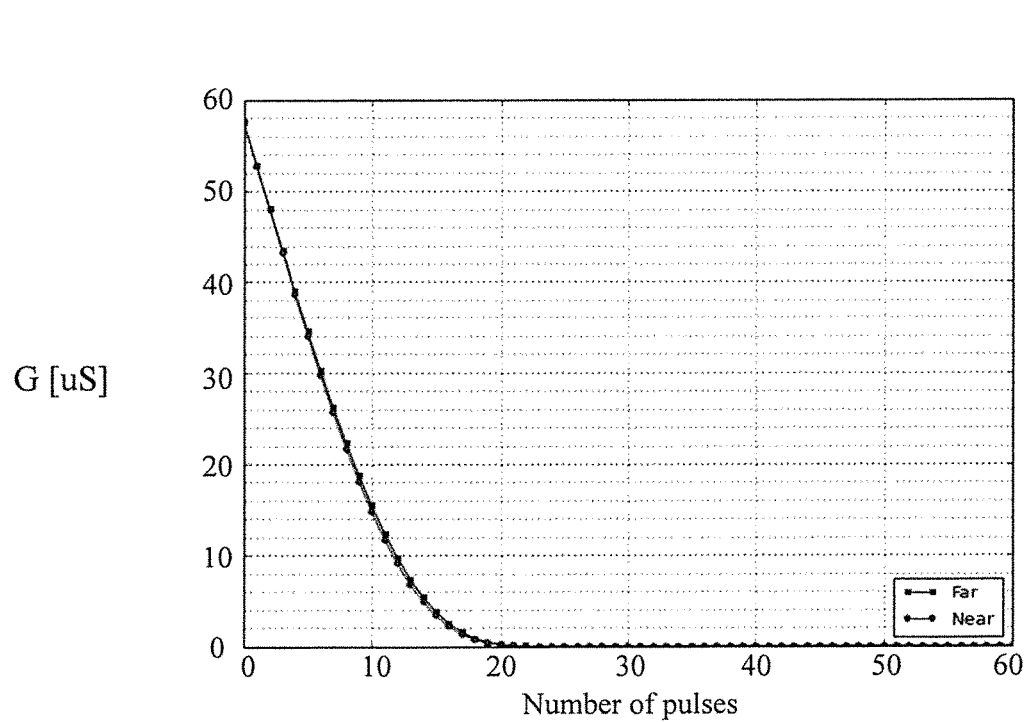

Referring to FIGS. 36-37 (plots 3600 and 3700, respectively), the same are directed to Case 1-PA and the use of a pulse having a 25.6 ns width at 15.625 nA.

Figure 38:
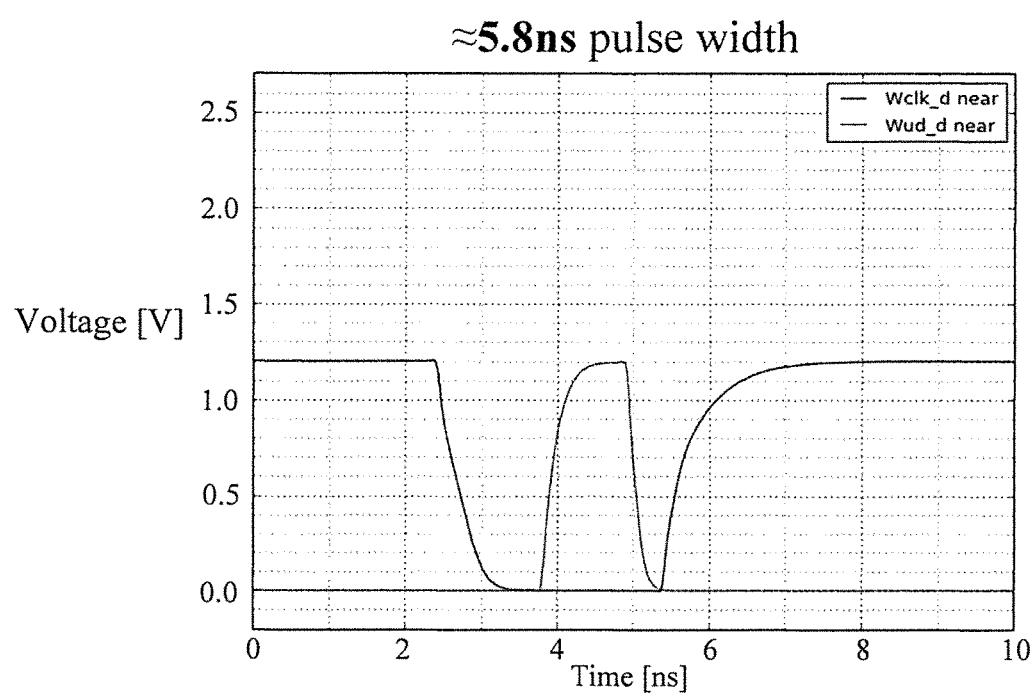
FIGS. 38-40 are plots directed to Case 1-PI, decrementing the gate voltage of transistor T6, and the use of a pulse having a 3.1 ns width.
Figure 39:
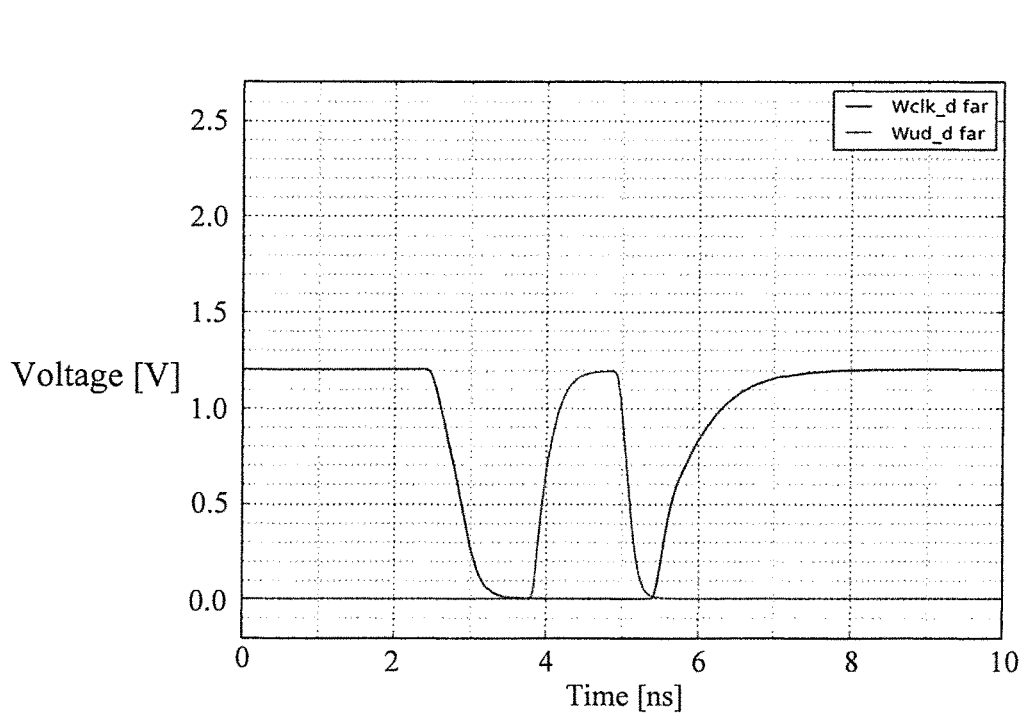
Figure 40:
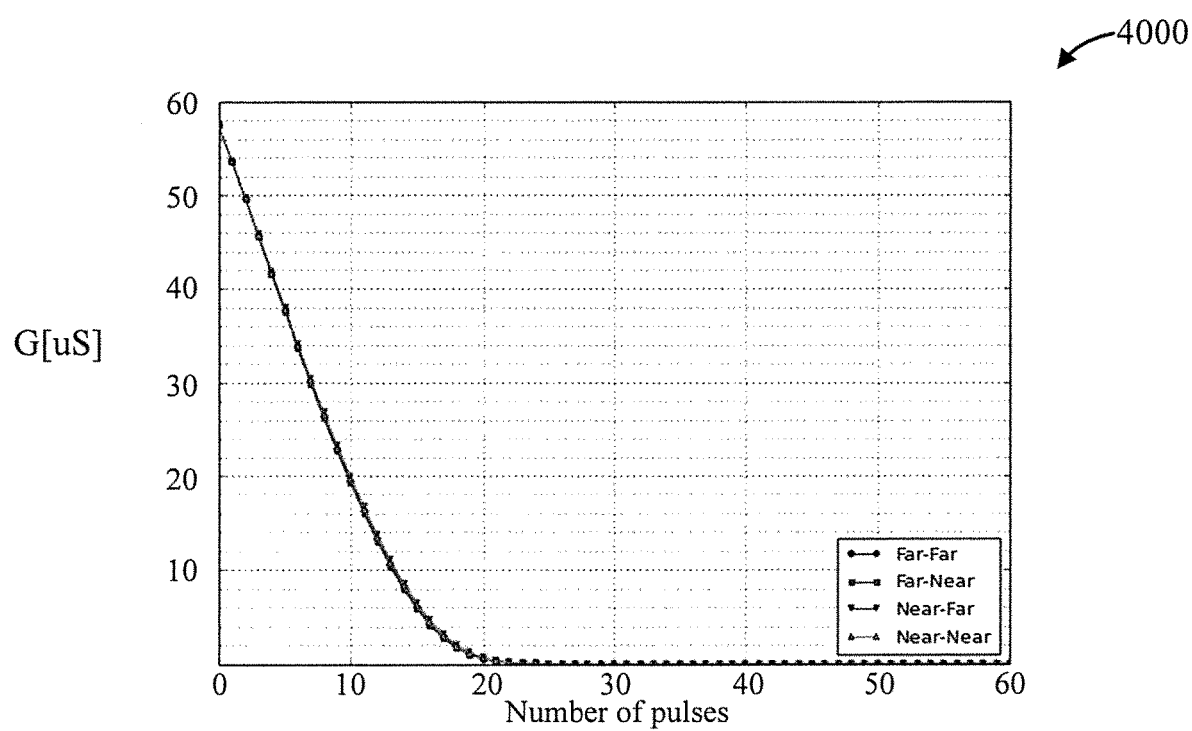

Referring to FIGS. 38-40 (plots 3800, 3900, and 4000, respectively), the same are directed to Case 1-PI and the use of a pulse having a 5.8 ns width.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 41:
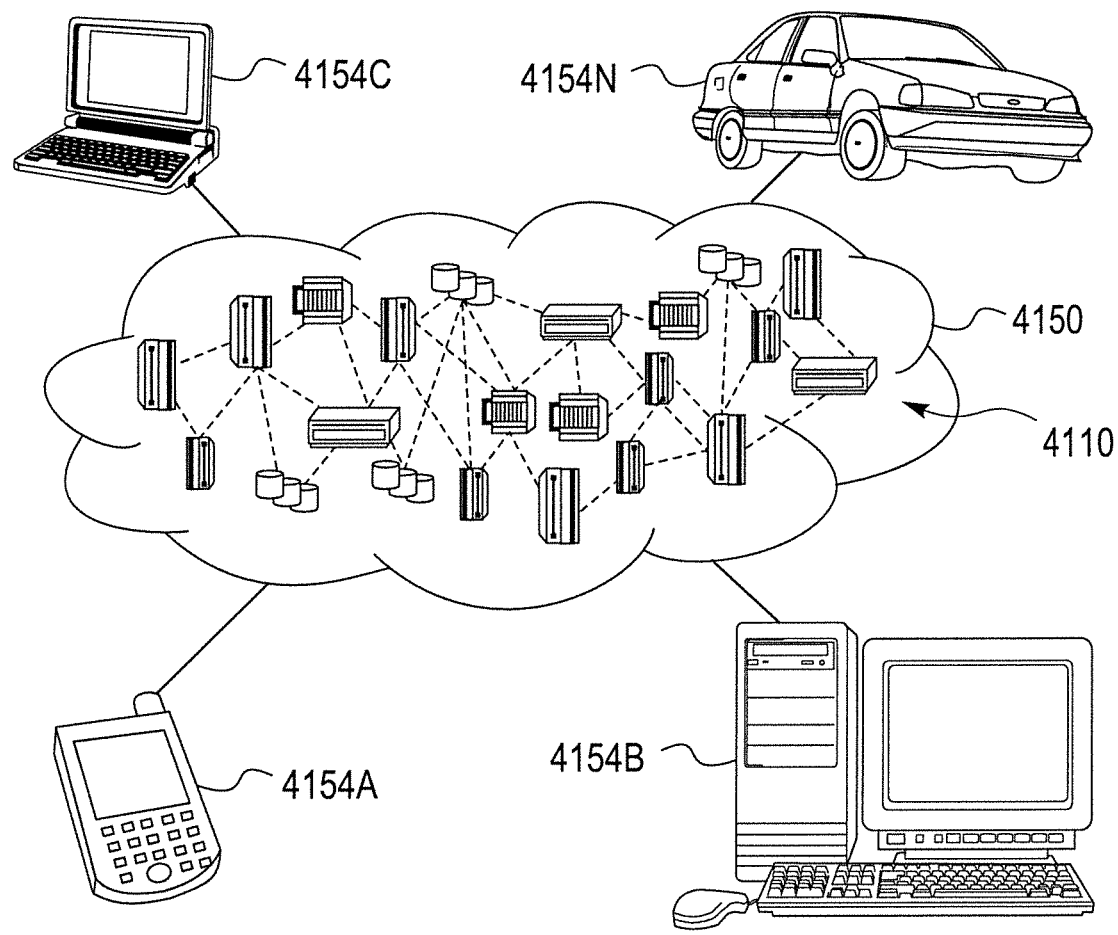
FIG. 41 is a block diagram showing an illustrative cloud computing environment having one or more cloud computing nodes with which local computing devices used by cloud consumers communicate, in accordance with an embodiment of the present invention.

Referring now to FIG. 41, illustrative cloud computing environment 4150 is depicted. As shown, cloud computing environment 4150 includes one or more cloud computing nodes 4110 with which local computing devices used by cloud consumers, such as, for example, personal digital assistant (PDA) or cellular telephone 4154A, desktop computer 4154B, laptop computer 4154C, and/or automobile computer system 4154N may communicate. Nodes 4110 may communicate with one another. They may be grouped (not shown) physically or virtually, in one or more networks, such as Private, Community, Public, or Hybrid clouds as described hereinabove, or a combination thereof. This allows cloud computing environment 4150 to offer infrastructure, platforms and/or software as services for which a cloud consumer does not need to maintain resources on a local computing device. It is understood that the types of computing devices 4154A-N shown in FIG. 41 are intended to be illustrative only and that computing nodes 4110 and cloud computing environment 4150 can communicate with any type of computerized device over any type of network and/or network addressable connection (e.g., using a web browser).

Figure 42:
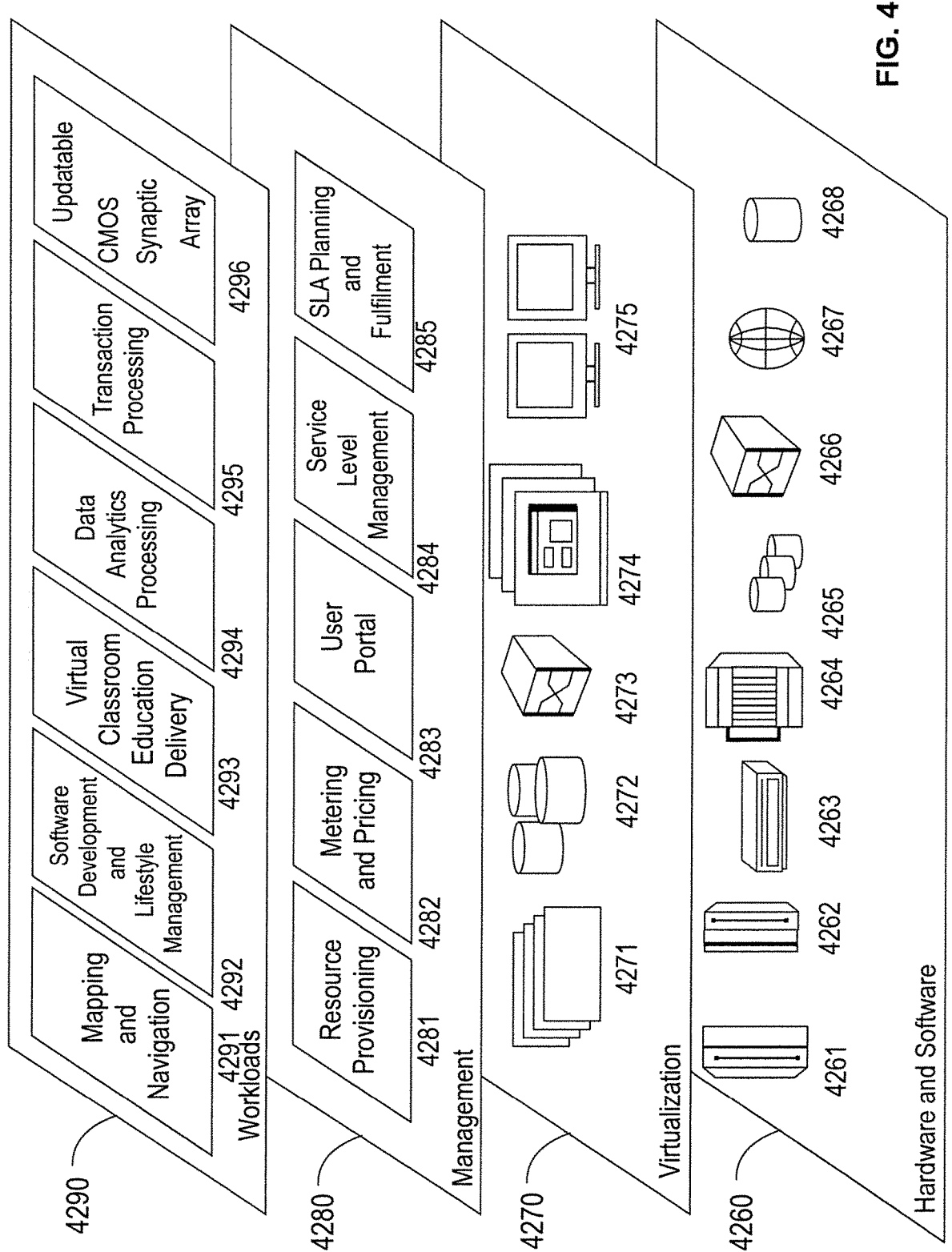
FIG. 42 is a block diagram showing a set of functional abstraction layers provided by a cloud computing environment, in accordance with an embodiment of the present invention.

Referring now to FIG. 42, a set of functional abstraction layers provided by cloud computing environment 4150 (FIG. 41) is shown. It should be understood in advance that the components, layers, and functions shown in FIG. 42 are intended to be illustrative only and embodiments of the invention are not limited thereto. As depicted, the following layers and corresponding functions are provided:

Hardware and software layer 4260 includes hardware and software components. Examples of hardware components include: mainframes 4261; RISC (Reduced Instruction Set Computer) architecture based servers 4262; servers 4263; blade servers 4264; storage devices 4265; and networks and networking components 4266. In some embodiments, software components include network application server software 4267 and database software 4268.

Virtualization layer 4270 provides an abstraction layer from which the following examples of virtual entities may be provided: virtual servers 4271; virtual storage 4272; virtual networks 4273, including virtual private networks; virtual applications and operating systems 4274; and virtual clients 4275.

In one example, management layer 4280 may provide the functions described below. Resource provisioning 4281 provides dynamic procurement of computing resources and other resources that are utilized to perform tasks within the cloud computing environment. Metering and Pricing 4282 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 4283 provides access to the cloud computing environment for consumers and system administrators. Service level management 4284 provides cloud computing resource allocation and management such that required service levels are met. Service Level Agreement (SLA) planning and fulfillment 4285 provide pre-arrangement for, and procurement of, cloud computing resources for which a future requirement is anticipated in accordance with an SLA.

Workloads layer 4290 provides examples of functionality for which the cloud computing environment may be utilized. Examples of workloads and functions which may be provided from this layer include: mapping and navigation 4291; software development and lifecycle management 4292; virtual classroom education delivery 4293; data analytics processing 4294; transaction processing 4295; and linearly weight updatable CMOS synaptic array without cell location dependence 4296.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as SMALLTALK, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A neuromorphic circuit, comprising:
a crossbar synaptic array cell including a Complimentary Metal-Oxide-Semiconductor (CMOS) transistor having an on-resistance controlled by a gate voltage of the CMOS transistor to update a weight of the crossbar synaptic array cell,
wherein the gate voltage of the CMOS transistor is controlled by performing a charge sharing technique that updates the weight of the crossbar synaptic array cell using non-overlapping pulses on cell control lines that are aligned with a set of row lines and a set of column lines.

2. The neuromorphic circuit of claim 1, wherein the crossbar synaptic array cell comprises three capacitors C1, C2, and C3 to update the gate voltage, and the charge sharing technique is performed row-by-row such that the gate voltage is, in an incremental manner, updated by using the capacitors C1 and C3, and that the gate voltage is, in a decremental manner, updated by using the capacitors C2 and C3.

3. The neuromorphic circuit of claim 2, wherein the neuromorphic circuit further comprises:
a pair of serially connected p-type Field Effect Transistors (pFETs);
a pair of serially connected nFETs,
wherein an end of the capacitor C1 is connected to a common point between the pair of serially connected pFETs, and an end of the capacitor C2 is connected to a common point between the pair of serially connected nFETs.

4. The neuromorphic circuit of claim 2, wherein an end of the capacitor C3 is connected to a common point between the pair of pFETs and the pair of nFETs.

5. The neuromorphic circuit of claim 2, wherein the synaptic array cell comprises:
a pair of p-type Field Effect Transistors (pFETs), connected in series, for adjusting the capacitors C1 and C3; and
a pair of nFETs, connected in series to each other and to the pair of pFETs, for adjusting the capacitors C2 and C3.

6. The neuromorphic circuit of claim 5, wherein the synaptic cell further comprises a connection point serially connecting the pair of pFETs to the pair of nFETs and further connected to an end of the capacitor C3 and the gate of the CMOS transistor.

7. The neuromorphic circuit of claim 5, wherein the neuromorphic chip performs the charge sharing technique such that an update increment line and a clock increment-line are switched with the non-overlapping pulses to perform an update in the incremental manner.

8. The neuromorphic circuit of claim 5, wherein the neuromorphic chip performs the charge sharing technique such that an update decrement line and a clock decrement-line are switched with the non-overlapping pulses to perform an update in the decremental manner.

9. The neuromorphic circuit of claim 5, wherein the capacitors C1 and C2 are respectively substituted with parasitic capacitances of the pair of pFETs and the pair of nFETs.

10. A neuromorphic chip, comprising:
a synaptic array formed from crossbar synaptic array cells,
wherein each of the crossbar synaptic array cells includes a Complimentary Metal-Oxide-Semiconductor (CMOS) transistor having an on-resistance controlled by a gate voltage of the CMOS transistor to update each of weights of the crossbar synaptic array cells, and
wherein the gate voltage of the CMOS transistor is controlled by performing a charge sharing technique that updates the weights of the crossbar synaptic array cells using non-overlapping pulses on cell control lines that are aligned with a set of row lines and a set of column lines.

11. The neuromorphic chip of claim 10, wherein each of the crossbar synaptic array cells comprises three capacitors C1, C2, and C3 to update the gate voltage, and the charge sharing technique is performed row by row such that the gate voltage is, in an incremental manner, updated by using the capacitors C1 and C3, and that the gate voltage is, in a decremental manner, updated by using the capacitors C2 and C3.

12. The neuromorphic chip of claim 11, wherein the neuromorphic circuit further comprises:
   a pair of serially connected p-type Field Effect Transistors (pFETs);
   a pair of serially connected nFETs,
   wherein an end of the capacitor C1 is connected to a common point between the pair of serially connected pFETs, and an end of the capacitor C2 is connected to a common point between the pair of serially connected nFETs.

13. The neuromorphic chip of claim 12, wherein an end of the capacitor C3 is connected to a common point between the pair of pFETs and the pair of nFETs.

14. The neuromorphic chip of claim 12, wherein each of the synaptic array cells comprises:
   a pair of p-type Field Effect Transistors (pFETs), connected in series, for adjusting the capacitors C1 and C3; and
   a pair of nFETs, connected in series to each other and to the pair of pFETs, for adjusting the capacitors C2 and C3.

15. The neuromorphic chip of claim 14, wherein each of the synaptic cells further comprises a connection point serially connecting the pair of pFETs to the pair of nFETs and further connected to an end of the capacitor C3 and the gate of the CMOS transistor.

16. The neuromorphic chip of claim 14, wherein the neuromorphic chip performs the charge sharing technique such that an update increment line and a clock increment-line are switched with the non-overlapping pulses to perform an update in the incremental manner.

17. The neuromorphic chip of claim 14, wherein the neuromorphic chip performs the charge sharing technique such that an update decrement line and a clock decrement-line are switched with the non-overlapping pulses to perform an update in the decremental manner.

18. The neuromorphic chip of claim 14, wherein the capacitors C1 and C2 are respectively substituted with parasitic capacitances of the pair of pFETs and the pair of nFETs.

19. A method, comprising:
   forming a crossbar synaptic array cell including a Complimentary Metal-Oxide-Semiconductor (CMOS) transistor having an on-resistance controlled by a gate voltage of the CMOS transistor to update a weight of the crossbar synaptic array cell,
   wherein the gate voltage of the CMOS transistor is controlled by performing a charge sharing technique that updates the weight of the crossbar synaptic array cell using non-overlapping pulses on cell control lines that are aligned with a set of row lines and a set of column lines.

20. The method of claim 19, wherein the crossbar synaptic array cell is formed to include three capacitors C1, C2, and C3 to update the gate voltage, and the charge sharing technique is performed row by row such that the gate voltage is, in an incremental manner, updated by using the capacitors C1 and C3, and that the gate voltage is, in a decremental manner, updated by using the capacitors C2 and C3.

* * * * *